(12) United States Patent
Kim et al.

(10) Patent No.: US 11,075,204 B2
(45) Date of Patent: Jul. 27, 2021

(54) SEMICONDUCTOR DEVICE AND METHOD FOR FABRICATING THE SAME

(71) Applicant: XIA TAI XIN SEMICONDUCTOR (QING DAO) LTD., Qingdao (CN)

(72) Inventors: Jee-Hoon Kim, Singapore (SG); Hyunyoung Kim, Singapore (SG); Sungsoo Byeon, Singapore (SG); Sangyoung Park, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 49 days.

(21) Appl. No.: 16/679,339

(22) Filed: Nov. 11, 2019

(65) Prior Publication Data

US 2020/0194436 A1    Jun. 18, 2020

Related U.S. Application Data

(60) Provisional application No. 62/779,512, filed on Dec. 14, 2018, provisional application No. 62/781,617, filed on Dec. 19, 2018.

(51) Int. Cl.
*H01L 27/108*     (2006.01)

(52) U.S. Cl.
CPC .. *H01L 27/10814* (2013.01); *H01L 27/10855* (2013.01); *H01L 27/10873* (2013.01)

(58) Field of Classification Search
CPC ......... H01L 27/10814; H01L 27/10855; H01L 27/10873
See application file for complete search history.

(56) References Cited

U.S. PATENT DOCUMENTS

| 2005/0139888 A1* | 6/2005 | Kim | ...................... H01L 28/91 257/296 |
| 2018/0175042 A1* | 6/2018 | Jang | .................. H01L 27/10876 |

* cited by examiner

*Primary Examiner* — Thomas L Dickey
(74) *Attorney, Agent, or Firm* — ScienBiziP, P.C.

(57) ABSTRACT

A semiconductor device is disclosed, which comprises a capacitor structure formed over a device region of a substrate, and a buffer layer. The capacitor structure comprises a lower electrode having a U-shaped profile that opens away from the substrate, the U-shaped profile defines an interior surface and an opposing exterior surface; a dielectric liner extending into the U-shaped profile and conformally covering the interior surface of the lower electrode; and an upper electrode formed over the dielectric liner, extending into and filling the U-shaped profile, the upper electrode) includes a top conductive layer. The buffer layer formed on the top conductive layer of the upper electrode, wherein the lattice constant of the buffer layer is greater than that of the top conductive layer.

19 Claims, 21 Drawing Sheets

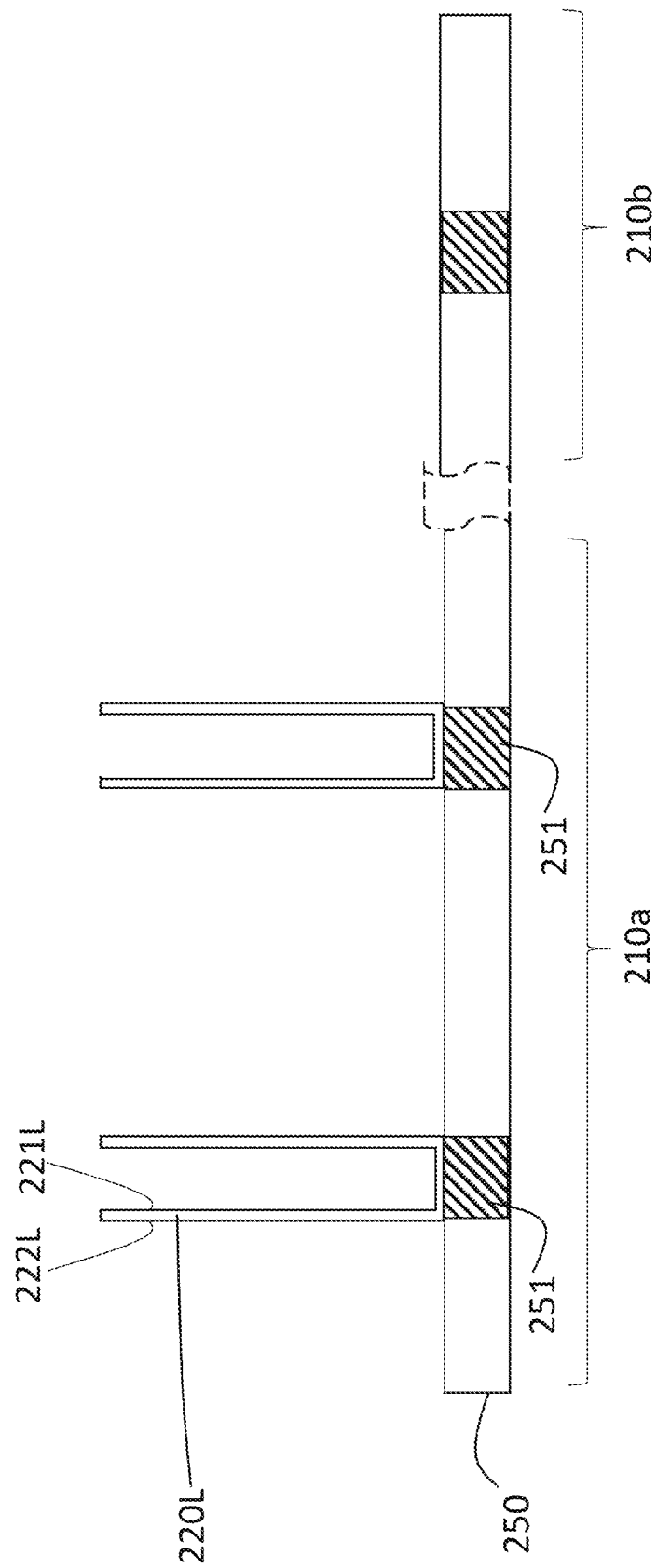

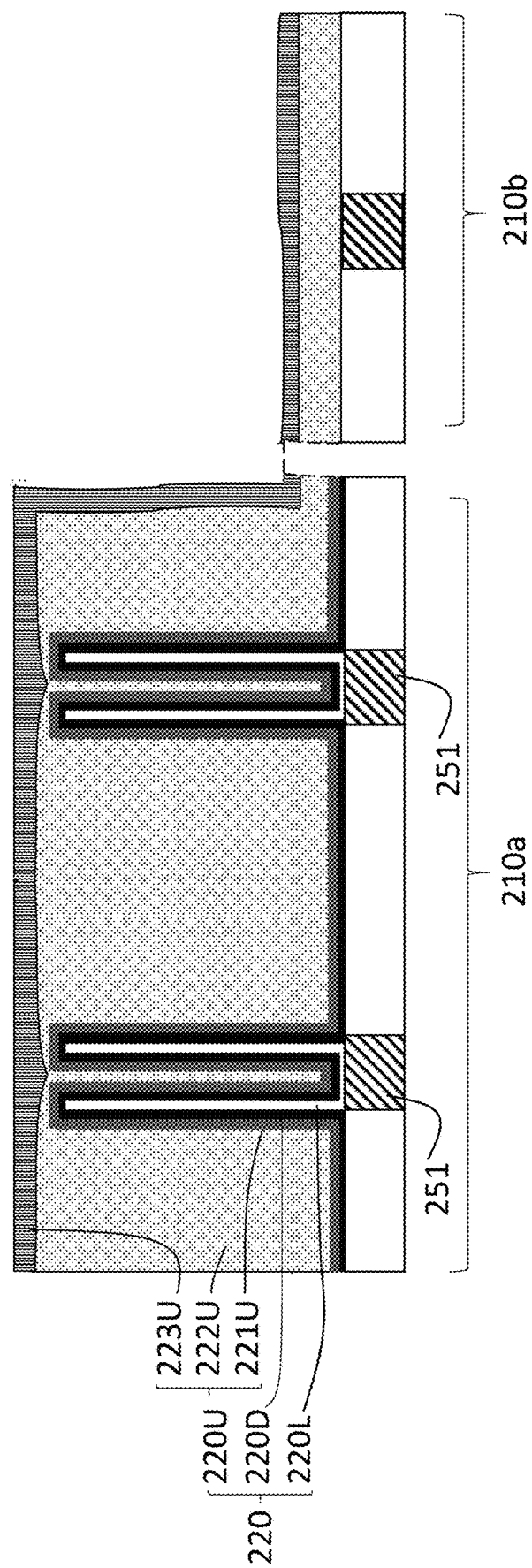

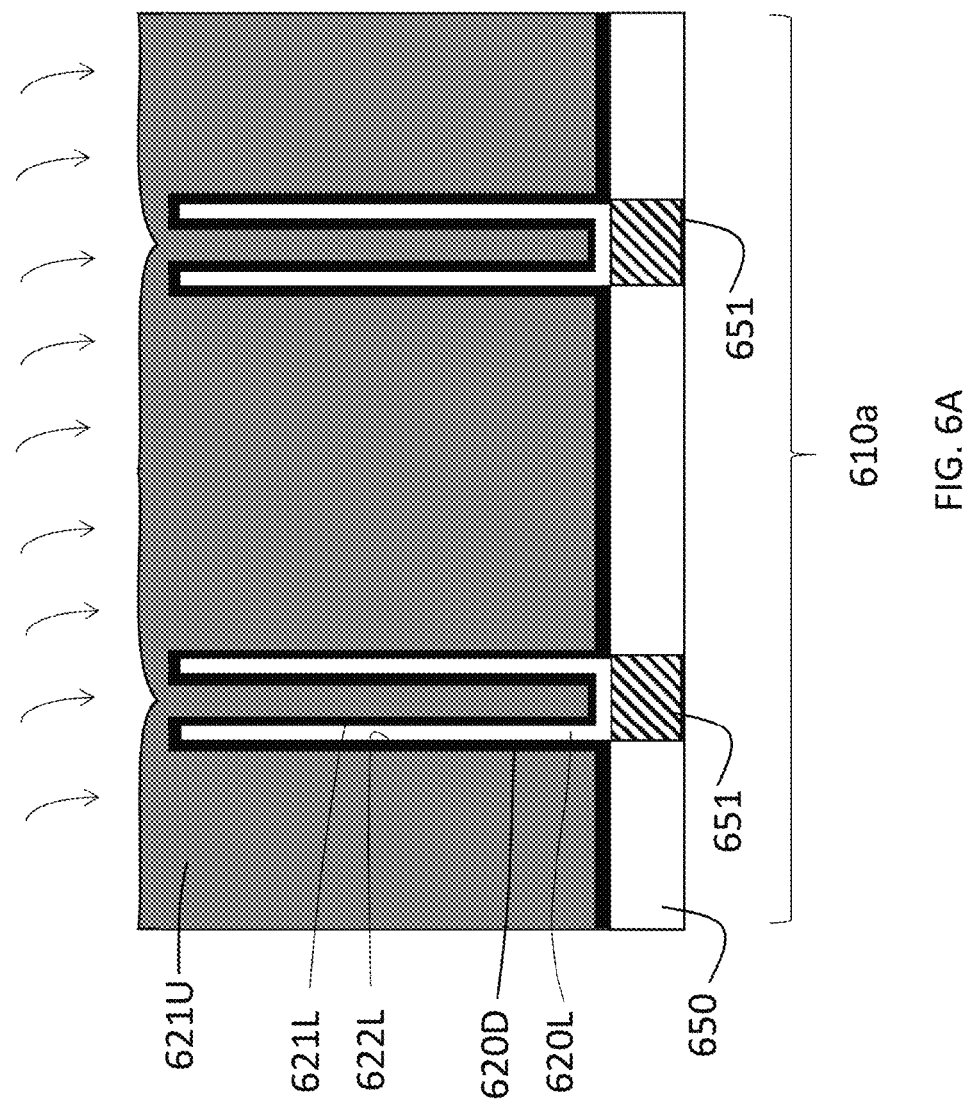

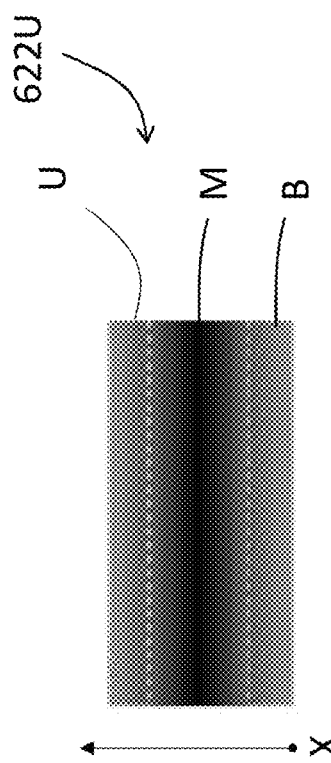
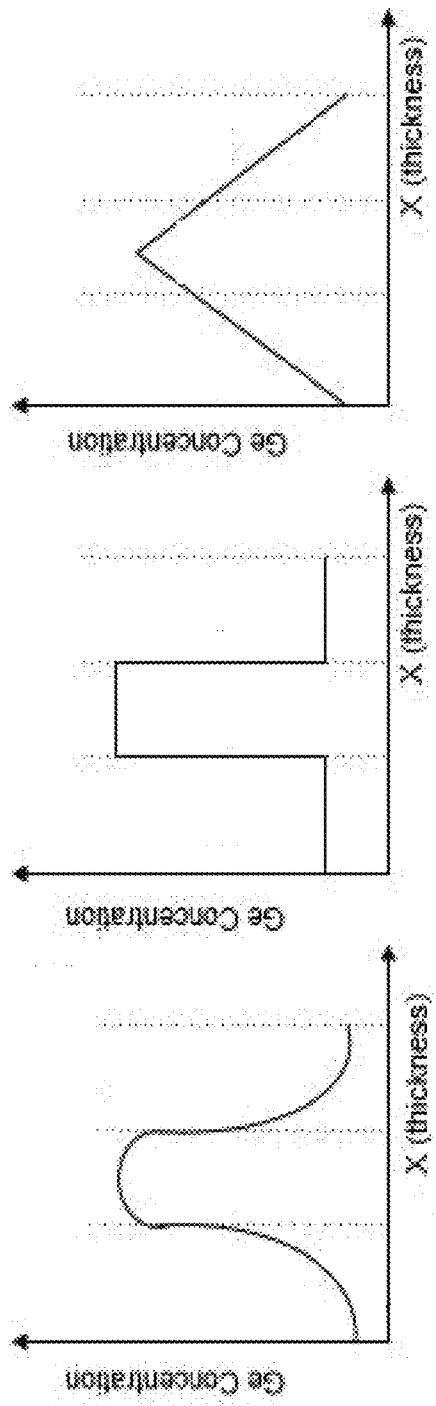

SEMICONDUCTOR DEVICE AND METHOD FOR FABRICATING THE SAME

CROSS-REFERENCE TO RELATED APPLICATIONS

This application claims the benefit of U.S. Provisional Patent Applications No. 62/779,512 filed on Dec. 14, 2018 and U.S. Provisional Patent Applications No. 62/781,617 filed on Dec. 19, 2018, which are hereby incorporated by reference herein and made a part of specification.

FIELD

The present disclosure generally relates to semiconductor device and method for fabricating the same, more specifically to a semiconductor device that includes capacitors.

BACKGROUND

Modern integrated circuits (IC) are designed to encompass millions of components such as transistors, capacitors, resistors with high device density. For example, a semiconductor device such as a DRAM (Dynamic Random Access Memory) includes a memory cell area and a peripheral circuit area defined on a semiconductor substrate. A plurality of memory cells may be formed in the memory cell area. Each cell may include a cell transistor and a storage node. The peripheral circuit area may include various peripheral circuits for performing operations such as read operation and write operation to the memory cells in the memory cell area.

The demand for higher degree of horizontal integration requires a reduction in horizontal dimensions (or feature size) of the integrated circuit components. For instance, the capacitors used in DRAMs are formed into a three-dimensional structure with increased vertical surface area, such that a reduction in horizontal dimensions of capacitors can be applied.

High aspect ratio and complex structure may be formed by performing a great number of semiconductor manufacturing processes. Accordingly, the stress applied to the wafer may be gradually increasing/accumulating due to the stacking of layers (often generating hetero-material interfaces) in the structure. The increased stress may impact the subsequent processes. For example, wafer warpage may occur as a result.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A-2H illustrate cross-sectional views of intermediate stages of fabricating semiconductor device in accordance with some embodiments of the instant disclosure.

FIGS. 6A-6B illustrate cross-sectional views of intermediate stages of fabricating semiconductor device in accordance with some embodiments of the instant disclosure.

FIGS. 7A-7D illustrate Ge content concentration of a silicon germanium layer in accordance with some embodiments of the instant disclosure.

Figure 1:
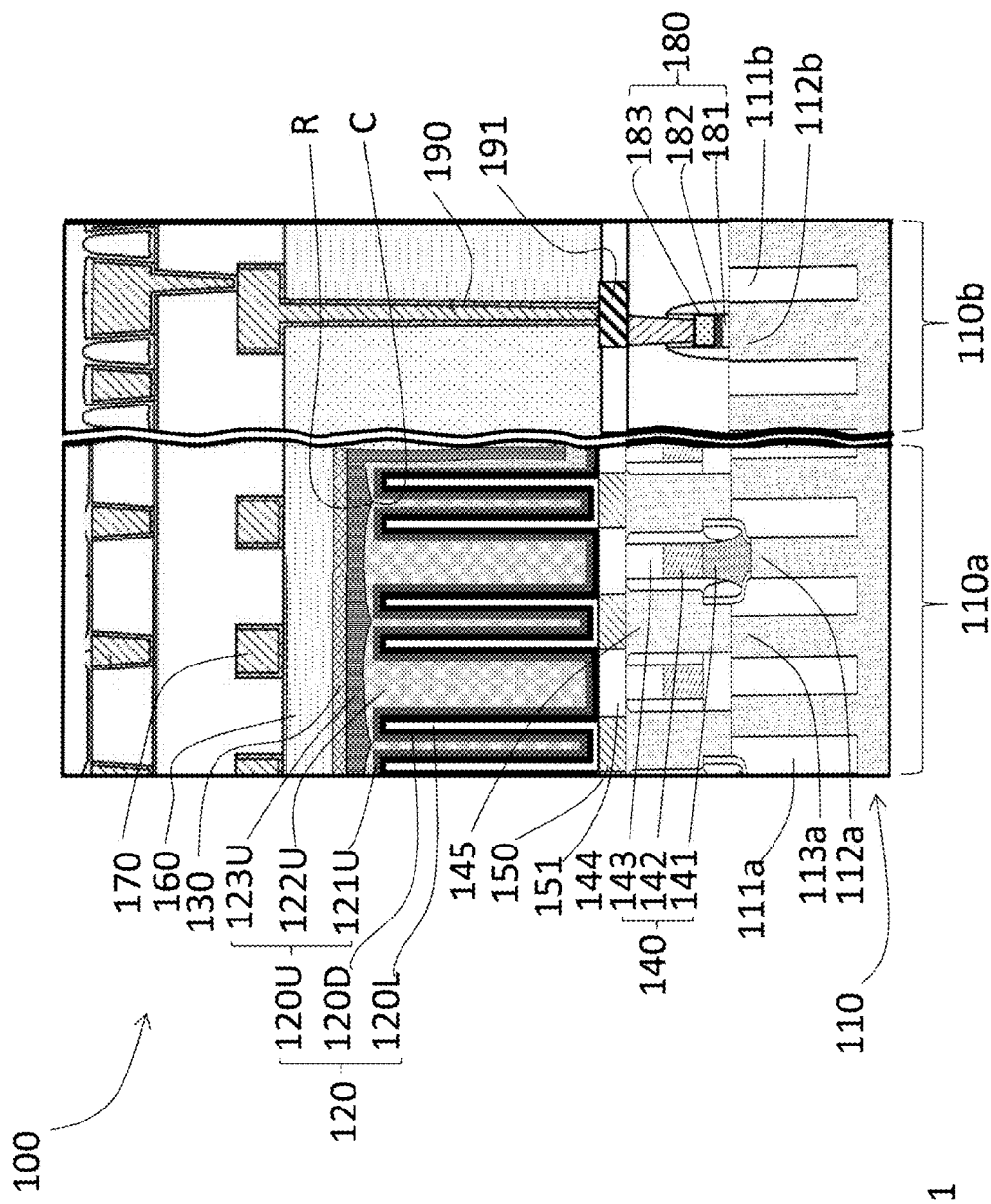
FIG. 1 illustrates a cross-sectional view of an exemplary semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 10. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a regional cross-sectional view of a semiconductor device 100 in accordance with the instant disclosure. For illustrational simplicity and clarity, some detail/sub components of the exemplary device are not explicitly labeled in the instant figure. The illustrative embodiment of the semiconductor device 100 may be, for example, a Dynamic Random Access Memory (DRAM) device.

The exemplary semiconductor device 100 comprises a semiconductor substrate 110 and multiple layers of integrated circuit devices and features formed on the substrate 110. Several functional regions may be arranged laterally (e.g., horizontally across the page as shown in FIG. 1) over the substrate 110. By way of example, FIG. 1 shows a substrate of an exemplary device that includes two co-planar arranged functional regions defined thereon, e.g., a device region (may also be referred as to a device region) 110a and a periphery region 110b.

The substrate 110 may comprise a crystalline silicon substrate. The substrate may comprise various doped regions depending on design requirements (e.g., p-type substrate or n-type substrate). The doped regions may be doped with p-type dopant, such as boron or $BF_2$; n-type dopant, such as phosphorus or arsenic; and/or combinations thereof. In some alternative embodiments, the substrate 110 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

The device region (or cell region) 110a may comprise various active regions 112a, 113a laterally separated by isolation features, such as STI 111a.

In the illustrated embodiment, several bit line (BL) stack features 140 are formed over the device region 110a. In practical applications, the BL stack features 140 may be a laterally traversing linear structure (e.g., extending in/out of the page of, e.g., FIG. 1) that projectively intersects multiple word lines.

In the illustrative embodiments, each of the BL stack feature 140 comprises a BL contact 141, a BL conductor 142, and a BL capping 143. The BL conductor 142, through the BL contact 141, electronically connects the active region 112a that act as S/D of a selection device (e.g., a transistor). The BL contact 141 may be made of conductive material such as poly silicon, metal, or metal silicide. The BL conductor 142 may include conductive material such as poly silicon, metal, or metal silicide.

Although not shown in FIG. 1, word lines such as buried channel array transistor (BCAT) may be formed in the substrate 110; however, the type of transistor is not limited thereto. For instance, the transistor may be planar transistor, a recessed channel array transistor (RCAT), or a sphere-shaped recess channel array transistor (SRCAT). In practical applications, a word line may be a linear structure that projectively intersects the bit lines. A word line may act as a gate of the selection device (e.g., a transistor).

The storage node contacts 145 may be formed by depositing a layer of polysilicon, metal, metal silicide, or metal nitride. Alternatively, the storage node contacts 145 may be formed by forming an epitaxial silicon layer. Differently, the storage node contacts 145 may be formed by forming an epitaxial silicon layer and depositing a metal layer.

In the illustrated embodiments, a landing pad 150 and the storage node contact 145 cooperatively establish a vertical conductive path connecting lower electrodes (e.g., lower electrodes 120L) of a capacitors and top surface of active region 113a that act as S/D of a selection device. In addition, a landing pad insulating layer 151 may be formed to electrically separate the landing pads 150 from each other. The landing pad 150 may be optional. For example, the storage node contact may be formed to physically contact with lower electrode of a capacitor.

In the illustrated embodiment, array of memory unit cells may be formed over the device region 110a of the substrate 110. Each of the memory cell units typically includes an aforementioned selection device and a storage element (e.g., capacitor structure 120).

A plurality of capacitor structures may be formed over the substrate 110. A capacitor structure comprises a lower electrode electronically connected to a transistor there-below through a storage node contact, a capacitor dielectric formed on the lower electrode, and a upper electrode formed over the capacitor dielectric. In the exemplary embodiment, capacitor structures 120 are formed over the device region 110a of the substrate 110. The capacitor structure 120 includes a lower electrode 120L, a dielectric liner 120D lining on the lower electrode 120L, and an upper electrode 120U filling the gaps between the lower electrodes 120L.

Lower electrodes (also referred as to a capacitor lower electrode) may be formed over the substrate 110 with cylindrical or pillar-shaped structures having high aspect ratio (i.e., high depth to width ratio). In the illustrative embodiments, the lower electrode 120L has a cylindrical structure corresponds to a tall upward opening U-shaped cross sectional profile (i.e., opens away from the substrate 110). The lower electrode 120L may be formed from a conformal conductive film made of one or more conductive material(s) such as BSRO ($(Ba,Sr)RuO_3$), CRO ($CaRuO_3$), LSCo ($(La,Sr)CoO_3$), TiN, TiAlN, TaN, TaAlN, W, WN, Ru, $RuO_2$, $SrRuO_3$, Ir, $IrO_2$, Pt, PtO, SRO ($SrRuO_3$).

In the illustrated embodiments, a dielectric liner 120D is provided to extend into the U-shaped profile of the lower electrode 120L and conformally covering the interior surface of the lower electrode 120L.

The capacitor dielectric liner 120D may be a conformally formed layer that comprises a nitride, an oxide, a metal oxide, or a combination thereof. For example, the capacitor dielectric liner 120D may include a single or a multilayered film formed from silicon nitride, silicon oxide, a metal oxide (e.g., $HfO_2$, $ZrO_2$, $Al_2O_3$, $La_2O_3$, $Ta_2O_3$, and $TiO_2$), a perovskite dielectric material (e.g., STO ($SrTiO_3$), BST (($Ba,Sr)TiO_3$), $BaTiO_3$, PZT, and PLZT, or a combination thereof. In some embodiments, high-K dielectric material may be applied to boost capacitor performance, e.g., enhance capacitance for a given electrode surface area.

The upper electrode 120U may comprise one or more conductive material such as doped semiconductor, conductive metal nitride, metal, metal silicide, conductive oxide, or a combination thereof. For instance, the upper electrode 120U may comprise conducive material(s) including BSRO (($Ba,Sr)RuO3$), CRO ($CaRuO3$), LSCo (($La,Sr)CoO3$), TiAlN, TaN, TaAlN, W, WN, Ru, RuO2, SrRuO3, Ir, IrO2, Pt, PtO, SRO ($SrRuO3$), though the list of suitable material is merely exemplary and not exhaustive. In the illustrative embodiments, the upper electrode 120U has a multi-layered structure. For example, the upper electrode 120U includes a conductive liner 121U conductive material 122U, and a top conductive layer 123U.

In the illustrative embodiments, the conductive liner 121U of the upper electrode 120U is formed to conformally cover the dielectric liner 120D and extending into the U-shaped profile of the lower electrode 120L. Conductive liner of upper electrode may be formed of conductive metal nitride, metal, metal silicide, conductive oxide, or a combination thereof. In some embodiments, the conductive liner 121U may comprise metal nitrides, therefore the conductive liner 121U is also referred to as a conductive layer. In the illustrative embodiments, the conductive liner 121U may be formed of Titanium Nitride (TiN).

In the illustrative embodiment, the conductive material 122U of the upper electrode 120U is provided on the conductive liner 121U and fills in the U-shaped profile of the lower electrode 120L. The conductive material may comprise one or more conductive material such as doped semiconductor, conductive metal nitride, metal, metal silicide, conductive oxide, or a combination thereof. In the illustrated embodiments, the conductive material 122U comprises of Silicon-Germanium (SiGe), thus also referred as to an alloy layer or a SiGe layer.

In the illustrative embodiments, the top conductive layer 123U of the upper electrode 120U covers the conductive material 122U. In some embodiments, top conductive layer may be formed of conducive material(s) including BSRO (($Ba,Sr)RuO_3$), CRO ($CaRuO_3$), LSCo (($La,Sr)CoO_3$), TiN, TiAlN, TaN, TaAlN, W, WN, Ru, $RuO_2$, $SrRuO_3$, Ir, $IrO_2$, Pt, PtO, SRO ($SrRuO_3$), though the list of suitable material is merely exemplary and not exhaustive. The exemplary top conductive layer 123U may be formed of tungsten (W).

In the illustrative embodiment, the conductive material 122U includes a concave regions C above the lower electrodes 120L, respectively. On the concave region, a downward pointing ridge profile R of the top conductive layer 123U may be formed. FIG. 1 shows that a portion of the top conductive layer 123U above the lower electrode 120L has greater thickness. For example, the downward pointing ridge profiles R possess a greater thickness than portions therebetween. In some scenarios, high aspect ratio of the U-shaped profile of lower electrodes may attribute to a downward pointing ridge profile R. For example, the U-shaped profile may not be fully filled by conductive material 122U (such as SiGe), therefore, above the U-shaped profile, a concave region C may be formed at top surface of SiGe. Such concave region C may shape the downward pointing ridge profile R of the top conductive layer 123U.

In the illustrative embodiments, a buffer layer 130 is formed on the top conductive layer 123U of the upper electrode 120U. In some embodiments, the lattice constant of the buffer layer 130 is greater than that of a top portion of the upper electrode 120U (i.e., the top conductive layer 123U). Due to the difference in lattice constant, compressive stress may be generated.

Later, a subsequent metallization process (e.g., formation process of metal line 170) may be performed. In addition, tensile stress that induces wafer warpage may be generated during/after the preforming of metallization process. Wafer warpage may result in adverse impacts on pattern uniformity and device reliability. To reduce warpage, process margin of the subsequent metallization formation process may be mindfully controlled.

It is worth mentioning that the buffer layer 130 with residual compressive stress may compensated the tensile stress. When the tensile stress is compensated, wafer warpage may be less likely to occur, thereby improving the pattern uniformity and device performance By the stress compensation facilitated by the buffer layer 130, a widening may be achieved to the margin of subsequent metallization formation process.

In the illustrated embodiment, the buffer layer 130 may be conductive and electronically connected to the top conductive layer 123U. An upper metal line (e.g., metal line 170) may establish electrical connection with an upper electrode (e.g., upper electrode 120U) through a via (not shown) that is physically connected to the buffer layer 130.

In some embodiments, the buffer layer 130 may be insulative and act as an interlayer insulation layer. A via (not shown) penetrating the buffer layer may be provided to establish an vertical electrical connection between an upper metal line (e.g., metal line 170) and an upper electrode.

In the embodiments where the buffer layer 130 is conductive, the buffer layer 130 may selectively comprise a nitride metal compound, a carbide metal compound, and a carbon nitride metal compound. For example, in some embodiments, the buffer layer 130 may comprise nitride metal compound. In some embodiments, the buffer layer 130 may comprise a metal nitride compound and a carbide metal compound. In some embodiments, the buffer layer 130 may comprise a nitride metal compound, a carbide metal compound, and a carbon nitride metal compound.

In some embodiments, the metal component in the buffer layer selectively comprises titanium and aluminum. In the illustrative embodiment, the buffer layer 130 comprises $Ti_xN_y$. The number of x and y may be in a range of about 0 to 50.

A thickness the buffer layer 130 may be in a range of about 1 to 100 nm. The thickness of the buffer layer 130 may be correspondingly designed with respect to the thickness of top conductive layer 123U, thereby maintaining an overall vertical size of a semiconductor device.

In some embodiments, a major metal content in the buffer layer 130 (e.g., a primary metal composition in the layer) is different from that in the top portion of the upper electrode 120U (e.g., the top conductive layer 123U). In the illustrative embodiments, the major metal content in the top conductive layer 123U may be tungsten; the major metal content in the buffer layer 130 may be titanium.

In the illustrated embodiment, an interlayer dielectric layer 160 is formed to cover capacitors (e.g., capacitors 120) over the device region 110a. Additional conductive features, such as upper metallization feature 170 and additional inter metal dielectric liners may be formed over the interlayer insulating layer 160 and the upper electrode 120U to enable interconnection between circuit elements. In the illustrative example, the interlayer insulating layer 160 is formed across the device region 110a and the periphery region 110b.

The periphery region 110b may comprise various active regions 112b laterally separated by isolation features, such as shallow trench isolation (STI) 111b. Above the active region 112b may formed an active circuit component (e.g., a gate structure 180) that make up the periphery support circuits, e.g., read-out, decoder, or amplifier circuits that controlling memory cells formed in the cell region. Over the active region there may be one or more upper inter device layers, through which contact via 190 may be provided to enable vertical signal conduction (e.g., from the gate structure 180) to a higher device layer. The contact via 190 may be connected to a corresponding contact pad 191 in a fashion similar to that in the device region 110a.

In the illustrated embodiment, the gate feature 180 may include a gate dielectric 181 over the active region 112b, a conductive layer 182, and a gate conductor 183 on the gate dielectric 181. The conductive layer 182 may comprise TiN. The gate conductor 183 may comprise one or more conductive material such as doped semiconductor, conductive metal nitride, metal, metal silicide, conductive oxide, or a combination thereof. In the illustrated embodiments, the gate conductor 183 comprises of Silicon-Germanium (SiGe), thus also referred as to an alloy layer or a SiGe layer.

In some embodiments, a process for forming the gate feature 180 may include the processes of: receiving a substrate (e.g., substrate 110); disposing a dielectric layer over the substrate; disposing a conductive layer on the dielectric layer; performing a passivation process on top surface of the conductive layer; performing an alloy layer formation process to dispose a SiGe layer across passivated top surface of the conductive layer; forming a well region in the substrate; patterning the SiGe layer and the dielectric layer to form a gate feature (e.g., gate feature 180); and performing a source/drain region formation process to form a source region and a drain region abuts the gate feature.

Descriptions will be made to the exemplary embodiments of passivation process and alloy layer formation process in conjunction with the accompanying drawings in FIG. 3 to FIG. 5.

FIGS. 2A-2H illustrate cross-sectional views of intermediate stages of fabricating semiconductor device in accordance with some embodiments of the instant disclosure. For illustrational simplicity and clarity, some components of the exemplary device are not shown or explicitly labeled in FIGS. 2A-2G. For example, components below the landing pad (such as substrate, BLs, storage node contacts) are not shown.

Figure 2A:
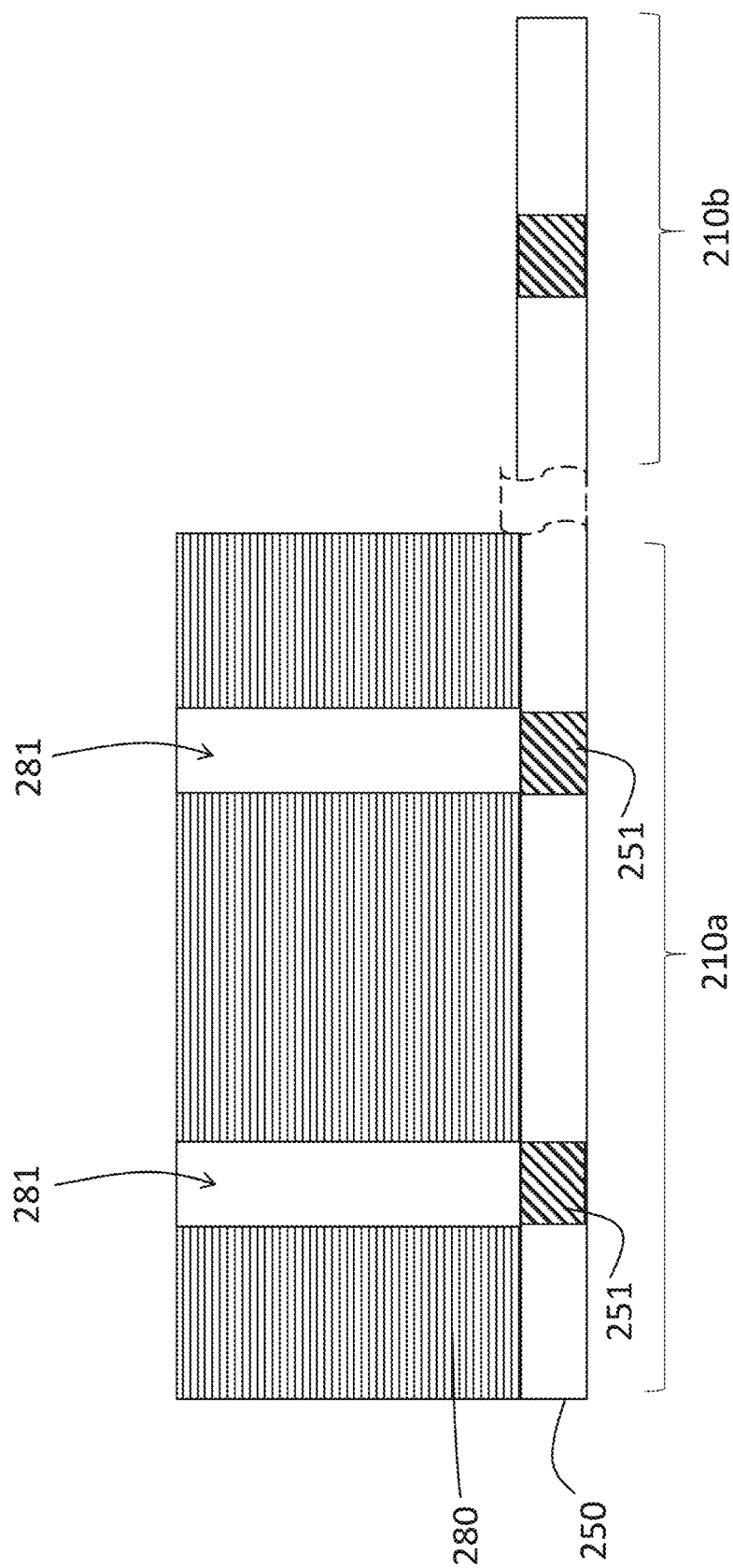

Referring to FIG. 2A, a mold layer 280 is formed over a plurality of landing pads 251 and an interlayer dielectric layer 250 over a substrate (e.g., substrate 110). Holes 281 exposing a surface of the landing pads 251 may be formed in the mold layer 280 by anisotropically etching the mold layer 280, for example, using photolithographic technic and followed by an etching process. The holes 281 may be provided with a cylindrical shape having a high aspect ratio.

Figure 2B:
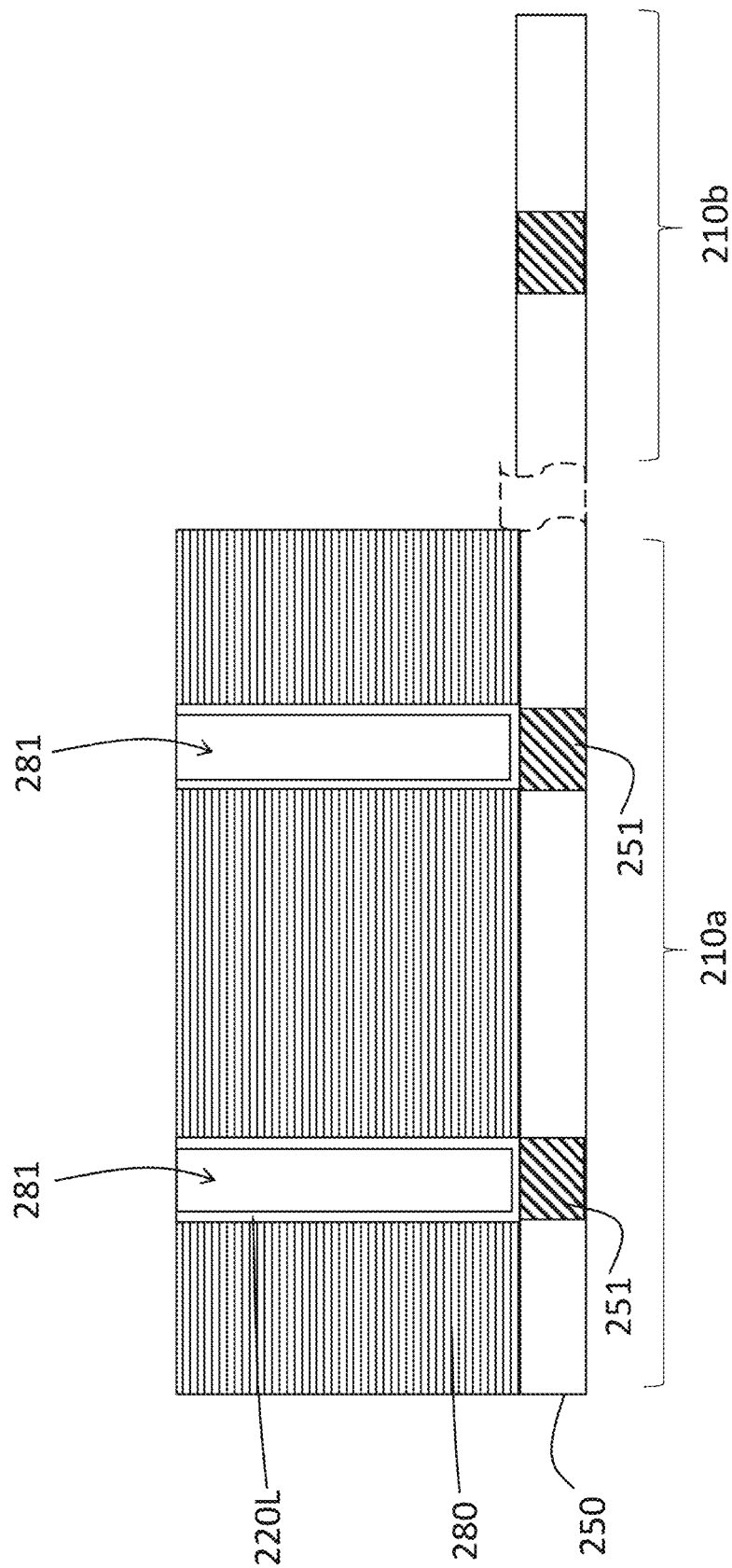

Referring to FIG. 2B, a plurality of lower electrodes 220L having a predetermined thickness are formed on top surfaces of the landing pads 251 and inner sidewall surfaces of the mold layer 280 defining the holes 281, respectively. The lower electrodes 220L are in physical contact with (thus electronically connected to) the landing pads 251, respectively. The lower electrode 220L has a U-shaped profile opens away from the substrate.

Referring to FIG. 2C, the U-shaped profile of the lower electrode 220L defines an interior surface 221L (shown in FIG. 2C) and an opposing exterior surface 222L (shown in FIG. 2C). In the illustrated embodiment, the mold layer 280 is removed thereby exposing exterior surface 222L of the lower electrodes 220L. The removal of the mold layer 280 may be performed by an ashing/stripping process, an isotropic etching process, and/or combinations thereof.

Figure 2D:
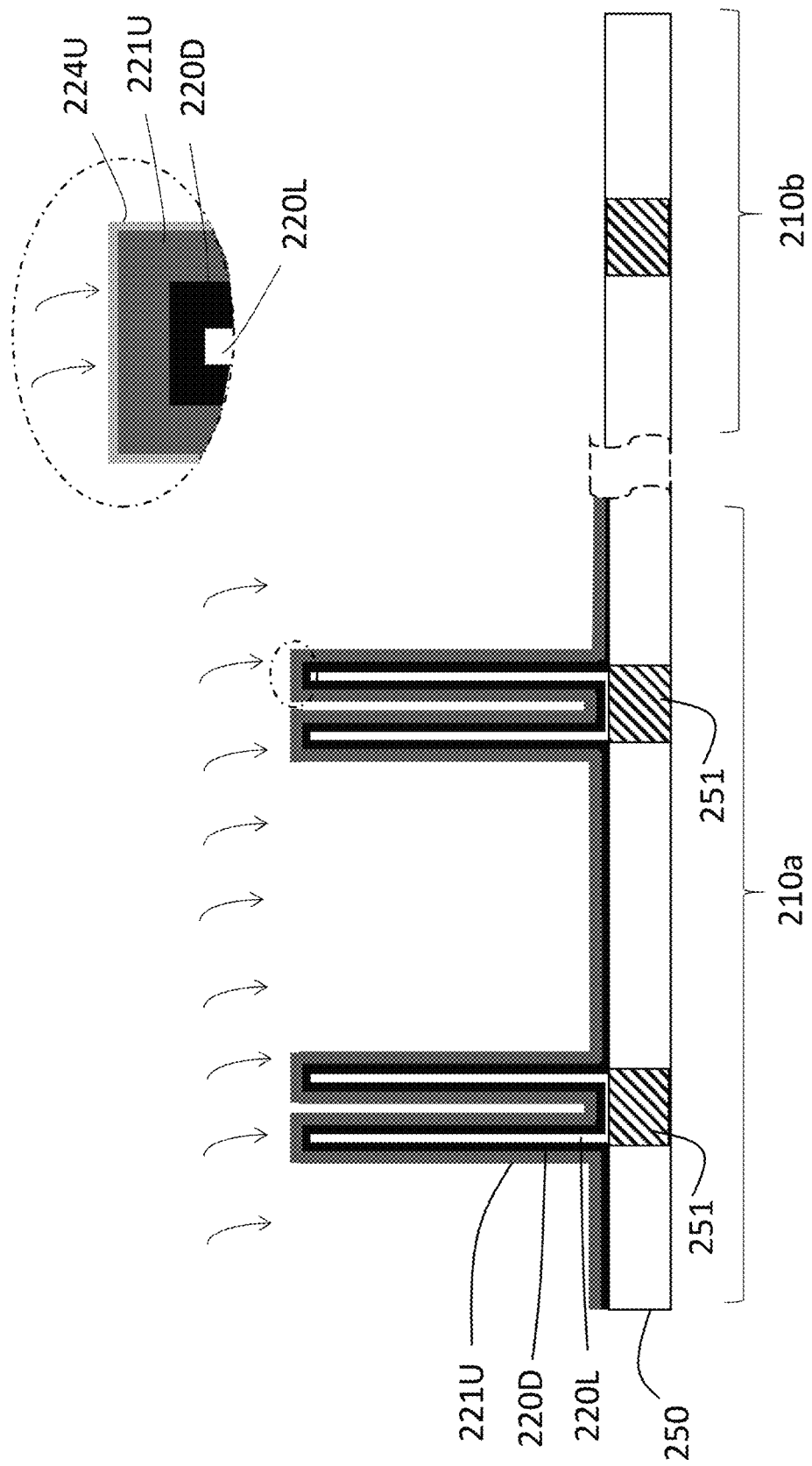

In the embodiment illustrated in FIG. 2D, a dielectric liner 220D is formed on exposed surface of the lower electrode 220L. The dielectric liner 220D is referred as to a capacitor dielectric (e.g., capacitor dielectric 120D). The dielectric liner 220D extends into the U-shaped profile and conformally covering interior surface 221L and exterior surface 222L of the lower electrode 220L. The dielectric liner 220D may be formed by using CVD process and/or ALD process.

In the illustrated embodiment, a conductive layer 221U is formed to conformally lining cover the dielectric liner 220D and extending into the U-shaped profile of the lower electrode 220L. Accordingly, the conductive layer 221U is also referred to as a conductive liner. In some embodiments, the conductive liner 221U may comprise metal nitrides (e.g., TiN).

In the illustrated embodiment, a passivation process is performed to top surface of the conductive layer 221U subsequent to the forming of the conductive layer 221U. A passivation layer 224U may be formed on top surface of the conductive layer 221U. The passivation process may comprises supplying a silicon source selectively comprising $SiH_4$, BTBAS, BTBAS, and DIPAS. In such embodiments, the passivation layer 224U may also be referred to as a silicon film 224U. Descriptions will be made to the exemplary embodiments of the passivation process in conjunction with the accompanying drawings in FIG. 3 to FIG. 5.

In the embodiment illustrated in FIG. 2E, a conductive material 222U is formed over and covering the conductive layer 221U. Although not shown, the conductive material 222U may be formed on the passivation layer 224U. The conductive material 222U may fill in and between the U-shaped profile of the lower electrodes 220L. In the illustrated embodiment, the conductive material 222U surrounds the exterior surface 222L (shown in FIG. 2C) of the lower electrodes 220L.

In some embodiments, the conductive material comprise one or more conductive material such as doped semiconductor, conductive metal nitride, metal, metal silicide, conductive oxide, or a combination thereof. In the illustrated embodiment, the conductive material 222U comprise Silicon-Germanium (SiGe) and may be referred to as an alloy layer or a SiGe layer. The conductive material 222U may be disposed by performing an alloy layer formation process. Descriptions will be made to the following exemplary embodiments of the alloy layer formation process in conjunction with the accompanying drawings in FIG. 5.

In the embodiment illustrated in FIG. 2E, a top conductive layer 223U is further formed on the conductive material 222U. The top conductive layer 223U may be formed of tungsten. The aforementioned conductive liner 221U, conductive material 222U, and top conductive layer 223U are collectively referred to as an upper electrode 220U. In the illustrated embodiment, the upper electrode 220U is formed over the dielectric liner 220D and extends into and filling the U-shaped profile of the lower electrode 220L.

In the illustrated embodiment, both of the conductive material 222U and the top conductive layer 223U cover periphery region 210b of the substrate. In some embodiments, the top conductive layer 223U is formed by CVD technique, thereby possessing good step coverage (e.g., covering both top surface and sidewall surface) over the conductive material 222U (SiGe layer). In the illustrated embodiment, the upper electrode 220U extends across the device region 210a of the substrate (e.g., substrate 110) and forms a plateau profile in a cross sectional view (as illustrated in FIG. 2E).

Figure 2F:
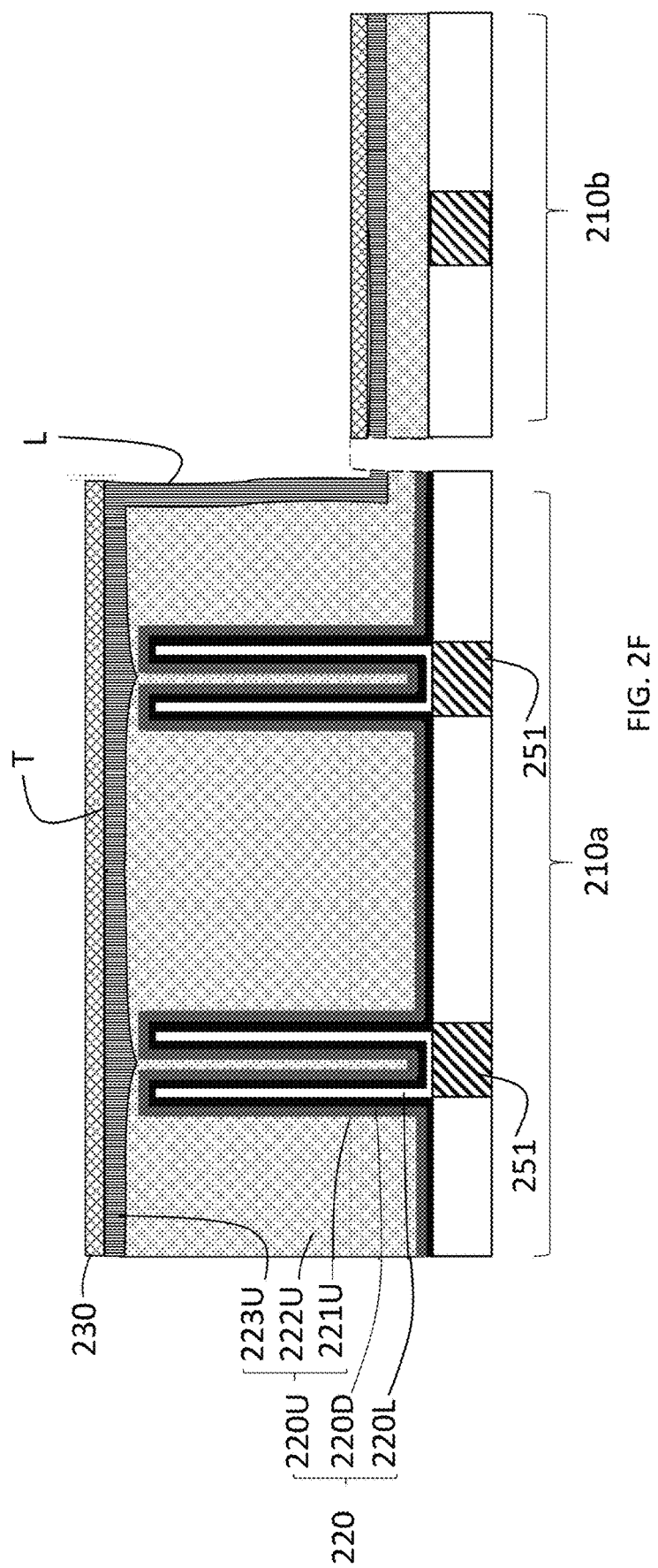

Referring to FIG. 2F, a buffer layer 230 is disposed on the top conductive layer 223U. In the illustrated embodiment, the buffer layer 230 is disposed over both the cell region 210a and periphery region 210b. In some embodiments, the buffer layer 230 is formed by performing a PVD process, such as a sputtering process (which possesses lower step coverage). In the illustrated embodiment, due to the low step coverage of the buffer layer 230 over non-horizontal surfaces, a thickness of a portion of the buffer layer 230 on top surface T of the upper electrode 220U is greater than that of a portion of the buffer layer 230 covering sidewall surface L of the plateau profile. As shown in the illustrated embodiment, sidewall surface L of the plateau profile may be substantially free from the buffer layer coverage.

Figure 2G:
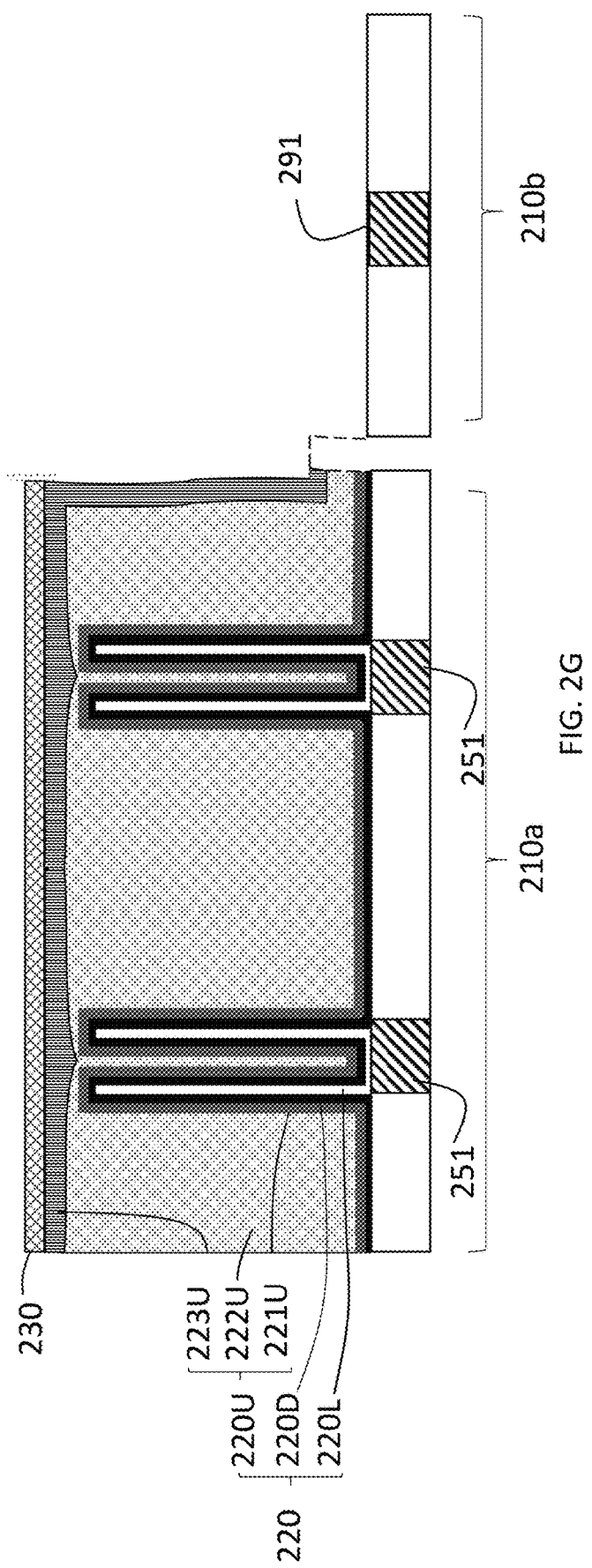

Referring to FIG. 2G, portions of the conductive material 223U and the buffer layer 230 that covers the periphery region 210b are removed (for example, by an etching process) to expose a contact pad 291.

Figure 2H:
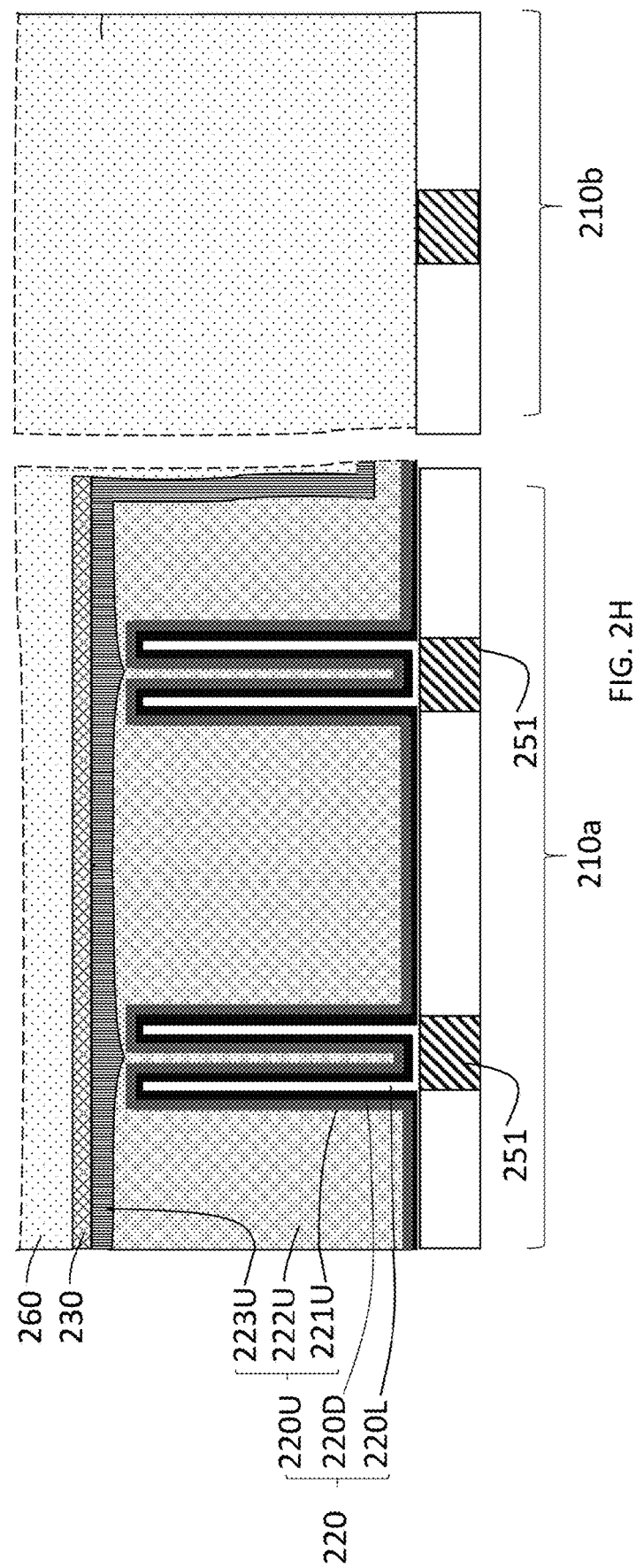

Referring to FIG. 2H, in the illustrated embodiment, an interlayer insulating layer 260 is formed to cover both the cell region 210a and the periphery region 210b.

Figure 3:
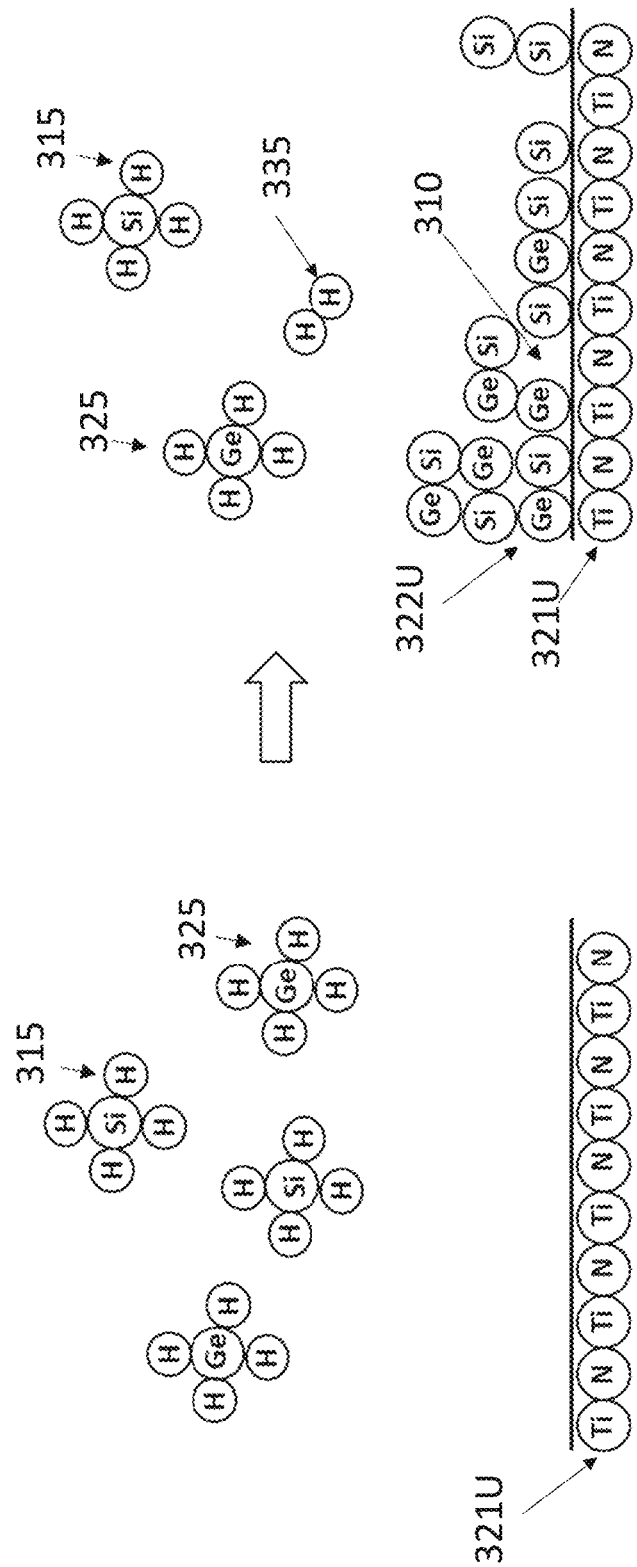
FIG. 3 illustrates an exemplary alloy formation process of a semiconductor structure in accordance with some embodiments.

FIG. 3 schematically illustrate a cross-sectional view of an intermediate stage of an alloy layer formation process in accordance with some embodiments of the instant disclosure. In some embodiments, the alloy layer formation process includes performing CVD in a batch type chamber. During CVD process, the wafer may be exposed to one or more volatile precursors, which react and/or decompose on the substrate surface to produce desired deposit. The progressing temperature may be set in a range from about 400 to 450° C.

Referring to the drawing at the left of the FIG. 3, reaction gas such as Si-containing gas (e.g., $SiH_4$ gas 315) and Ge-containing gas (e.g., $GeH_4$ gas 325) are supplied into the process chamber over the top surface of a TiN layer (e.g., conductive layer 321U). Additional precursors may be further supplied to enhance film quality or uniformity.

When SiGe layer 322U is deposited on non-SiGe surface, such as surface of conductive layer 321U, a heterojunction may be formed. A heterojunction is the interface that is formed between two layers or regions of dissimilar crystalline semiconductors. These semiconducting materials have unequal band gaps as opposed to a homojunction.

In the drawing at the right of FIG. 3, SiGe layer 322U is formed on top surface of conductive layer 321U. Since Si and Ge atoms tend to deposit easier on each other than on Ti or N atoms, interface defect 310 may be generated due to the incomplete atomic arrangement and mismatch of crystalline structures. However, the density of local area interface defect 310 may adversely impact in-wafer SiGe layer 322U thickness uniformity and/or wafer-to-wafer SiGe layer 322U thickness uniformity, which may result in deterioration of device performance (e.g., current leakage, capacitance-voltage curve, capacitor refresh).

In the illustrative embodiment, $H_2$ gas 335 generated during the formation of the SiGe layer 322U is removed by a purging process. Generally, the removal of volatile byproducts (such as C, H, N containing compounds) may reduce unforeseeable variation of electrical characteristics in the capacitor structure 320.

Figure 4:
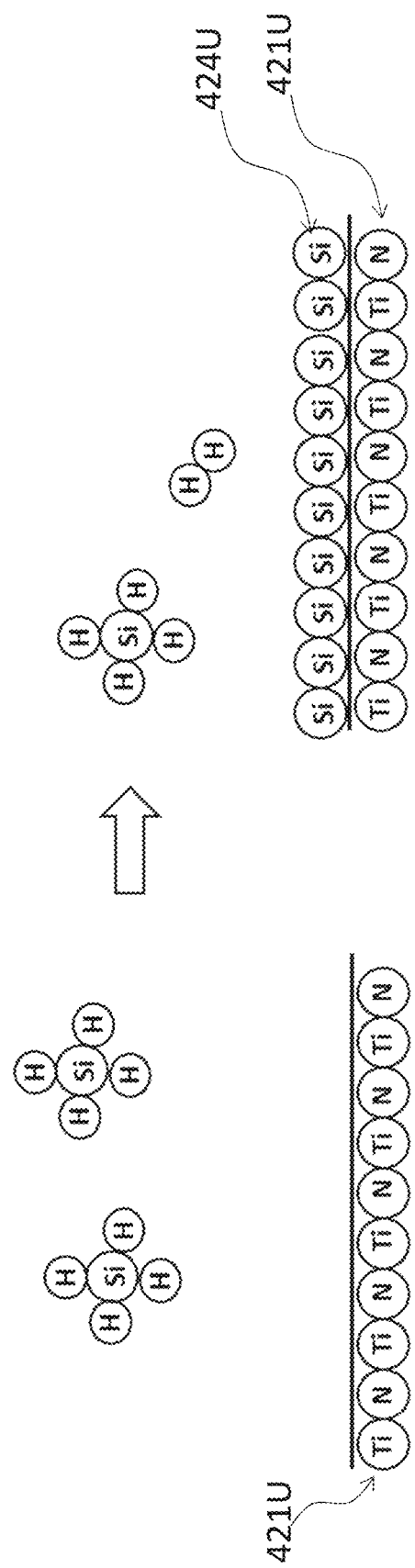
FIG. 4 illustrates an exemplary passivation process of a semiconductor structure in accordance with some embodiments.

FIG. 4 schematically illustrate a cross-sectional view of an intermediate stage of passivation process in accordance with some embodiments of the instant disclosure. In some embodiments, the alloy layer formation process includes performing a CVD process in a batch type chamber.

Referring to the drawing at the left of the FIG. 4, $SiH_4$ is supplied onto top surface of the conductive layer 421U (TiN). In the drawing at the right of the FIG. 4, a passivation layer 424U is first formed on top surface of the conductive layer 421U. In the illustrated embodiment, the passivation layer 424U is a silicon film with small thickness (may be a silicon monolayer). In the illustrative embodiments, $H_2$ gas generated during the formation of the passivation layer 424U may be purged. Optionally, silicon film deposition and byproduct purging processes may be repeated for more than one cycle depending on the concentration of Si-containing gas.

Figure 5:
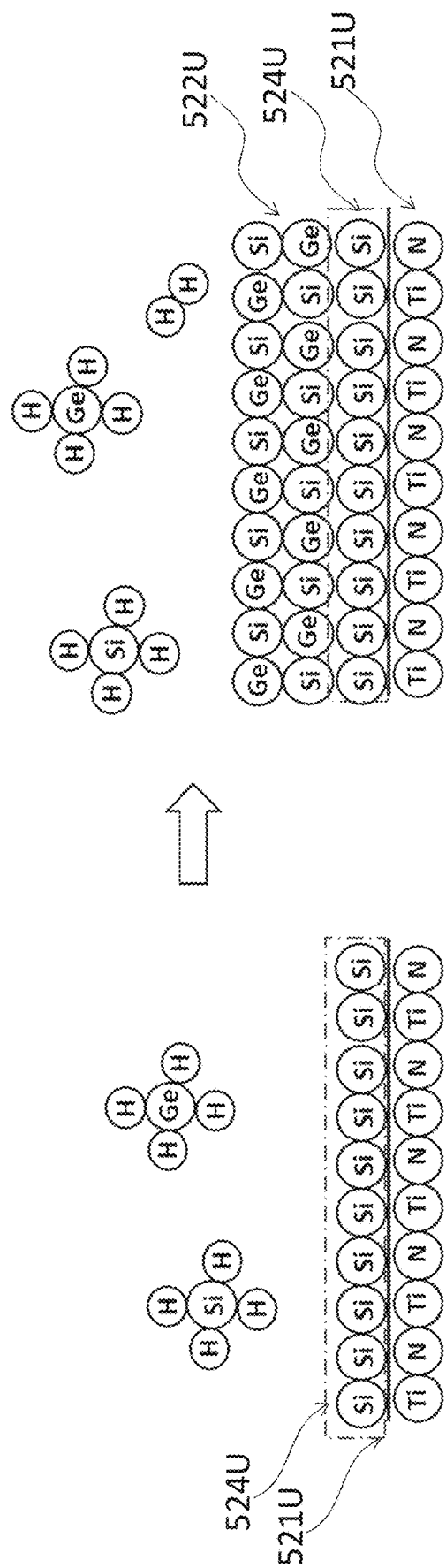
FIG. 5 illustrates an exemplary alloy formation process of a semiconductor structure in accordance with some embodiments.

FIG. 5 schematically illustrate a cross-sectional view of an intermediate stage of an alloy layer formation process in accordance with some embodiments of the instant disclosure. In some embodiments, the alloy layer formation process includes performing CVD in a batch type chamber. The progressing temperature may be set in a range of about 400 to 450° C.

Referring to the drawing at the left of the FIG. 5, a passivation layer 524U is formed beforehand on top surface of the conductive layer 521U (TiN). Referring to the drawing at the left of the FIG. 5, interface defect issue resulting from incomplete atomic arrangement and/or mismatch of crystalline structure may be alleviated when the SiGe layer 522U is pre-deposited on Si film 524U. As a result, thickness uniformity of the SiGe layer 522U and device performance may be improved. In some scenarios, the adhesion between the conductive layer 521U (TiN) and the SiGe layer 522U may be enhanced with the help of the silicon film 524U.

Figure 6B:
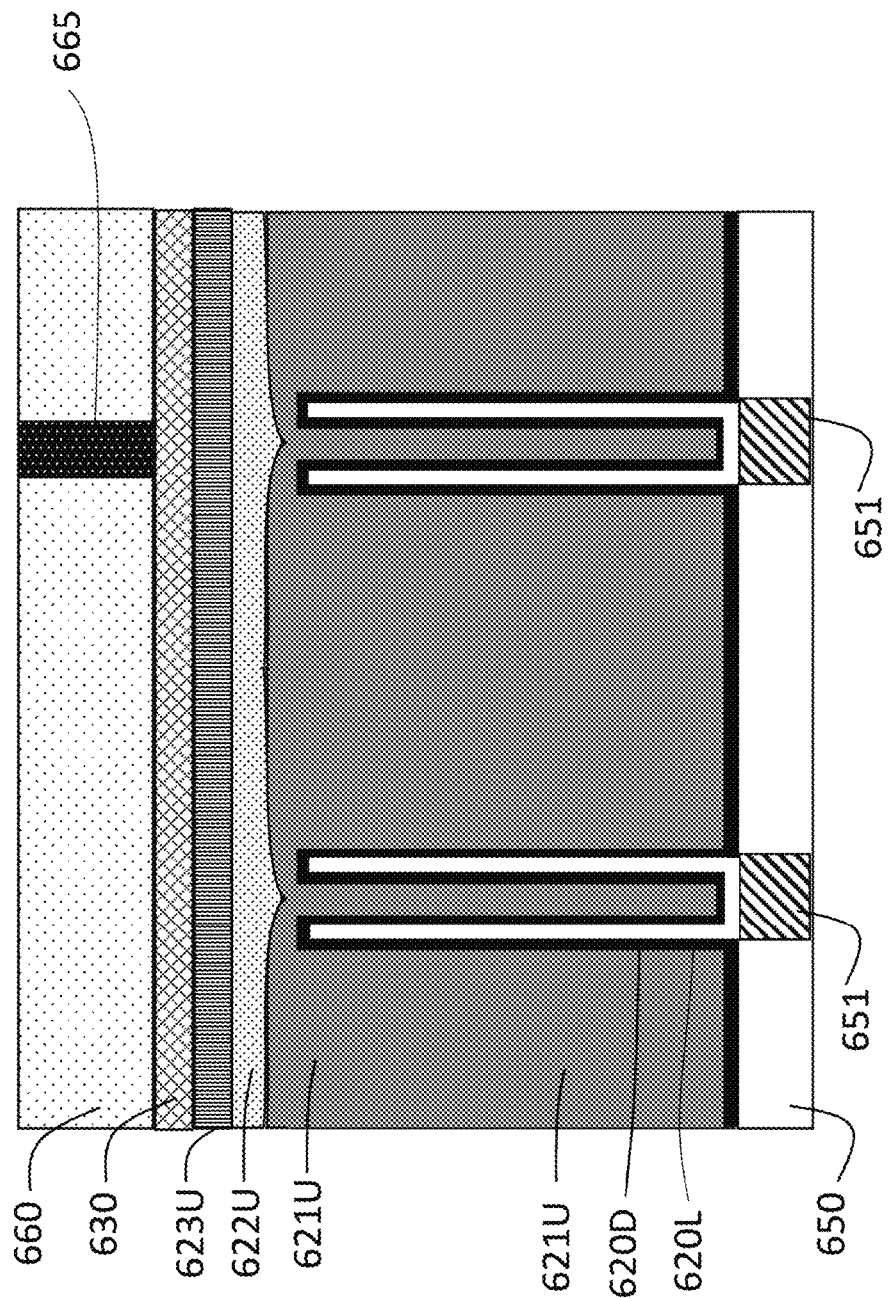

FIG. 6A to FIG. 6C illustrate cross-sectional view of intermediate stages of fabricating semiconductor device in accordance with some embodiments of the instant disclosure.

Referring to FIG. 6A, capacitor lower electrodes 620L are respectively formed over landing pads 651. An interlayer dielectric layer 650 laterally separates the plurality of landing pads 651 (which may collectively be part of a lower device layer). The interlayer dielectric layer 650 may be formed over and across a device region 610a of a substrate (e.g., substrate 110). The capacitor lower electrode 620L has a U-shaped profile defining an inner surface 621L and an exterior surface 622L in a cross section thereof. In the illustrated embodiments, a capacitor dielectric liner 620D is formed on both the inner surface 621L and exterior surface 622L of the capacitor lower electrodes 620L.

In some embodiments, the fabrication of the capacitor lower electrodes 620L and the capacitor dielectric liner 620D may utilize the aforementioned fabrication flow described in conjunction with accompany drawings in FIG. 2A to FIG. 2B.

In the illustrated embodiments, conductive layer 621U is disposed on the capacitor dielectric liner 620D and fills the U-shaped profile of the capacitor lower electrode 620L. The conductive layer 621U may include conductive metal nitride, metal, metal silicide, conductive oxide, or a combination thereof. In some embodiments, the conductive layer 621U comprises TiN.

Referring to FIG. 6B, an alloy formation process (also referred as to a SiGe layer formation process) is performed to form a SiGe layer 622U. In the illustrated embodiments, conductive layer 621U fills in and between the U-shaped capacitor lower electrodes 620L, and forms a substantially planar top surface that extends across the plurality of the capacitor lower electrodes 620L. The SiGe layer 622U formed on the substantially planar top surface of the conductive layer 621U also has a substantially planar profile extending across the plurality of the capacitor lower electrodes 620L without extending into the U-shaped profile of lower electrodes.

In some scenarios, the U-shaped profile may not be fully filled by the conductive layer 621U. Accordingly, a downward pointing ridge profile (e.g., the downward pointing ridge profile R as illustrated in FIG. 1) in the SiGe layer 622U may be formed above the lower electrode (e.g., at the upward opening region of the U-shape profile).

In the illustrative embodiments, a top conductive layer 623U, a buffer layer 630, and a interlayer dielectric layer 660 are sequentially formed over the SiGe layer 622U. A contact feature 665 penetrating the interlayer dielectric layer 660 may be subsequently formed to enable vertical electrical connection between the top conductive layer 623U and an upper metal line (e.g., metal line 170) over the interlayer dielectric layer 660.

In some embodiments, the composition of SiGe layer 622U may be formulated as $Si_{1-x}Ge_x$, wherein $0.15 \leq x \leq 0.6$.

In some embodiments, the SiGe layer 622U is provided with a grading Ge concentration distribution along a thickness direction.

FIGS. 7A-7D schematically illustrates a Ge concentration distribution along the x-axis (i.e., a thickness direction) of the exemplary SiGe layer 622U in accordance to the embodiments of instant disclosure.

Referring to FIG. 7A, the SiGe layer 622U has Ge concentration distribution that has a greatest value at a middle portion M of the SiGe layer 622U and decreases there-from upwardly and downwardly along a thickness direction. In some embodiments, a Ge content of the SiGe layer 622U in the middle portion M has a range of about 75 to 95 atomic %. In some embodiments, the Ge content in the middle portion M may account for 90 atomic %, whereas the two neighboring portions U, B may contain as low as 10%. For example, in the middle portion M, the Ge concentration may be $4.5e^{22}/cm^3$ and the Si concentration may be $0.5e^{22}/cm^3$.

In some embodiments, SiGe layer 622U may be formed by a low-pressure chemical vapor deposition (LPCVD) process and be subsequently crystallized by, for example, an annealing process. In some scenarios, the annealing temperature of the SiGe layer 622U decreases as the Ge content therein increases. However, having high Ge content at the heterojunctions in the two neighboring portions U, B may result in great lattice constant difference, thereby inducing stress (e.g., crystallization stress). The induced stress may be attributed to dislocation that may induce capacitor current leakage between SiGe layer 622U and a lower layer (e.g., the conductive layer 621U).

It is worth mentioning that, in the embodiments according to the instant disclosure, the relatively low Ge content concentration in the two neighboring portions U, B may lower the lattice constant difference, thereby alleviating stress and capacitor current leakage issues. Besides, the two neighboring portions U, B having relatively low Ge content concentration may act as a buffer for Ge diffusion form the middle portion M. In some scenarios, when the SiGe layer 622U has high concentration of Ge contents in the middle portion M and relatively low concentration in the two neighboring portions U, B, the induced stress thereof may reduce by at least 1 to 2 folds as compared with those with low Ge contents (which may need higher annealing temperature), therefore alleviate the leakage current issue.

In some embodiments, the thickness of the SiGe layer 622U may be in a range from about 1300 to 1600 Å. In some embodiments, the thickness of the SiGe layer 622U may be 1500 Å. In some embodiments, a thickness of the middle portion M may be 30 to 80% of the thickness of SiGe layer 622U. In some embodiments, the middle portion M may have a thickness in a range from about 200 to 400 Å. For example, a thickness of the middle portion M may be 300 Å, while each of the two neighboring portions U, B with relatively low Ge concentration may be about 600 Å.

In some embodiments, the SiGe layer formation process comprises supplying, in a cycle period, silane-based gas and germanium-based gas over the semiconductor device. A flow rate ratio between silane-based gas and germanium-based gas is initially raised and then reduced during the cycle period. As such, the SiGe layer 622U may possesses greatest Ge at a middle portion M thereof.

For example, the cycle period includes an initial session, an intermediate session and a final session. In the initial session and the final session, the flow rate ratio may be set in a range from about 10% to 30%. In the intermediate session, the flow rate ratio may be set greater than that in the initial and final session, for example, in a range from about 30% to 90%. In some embodiments, a duration length ratio between the intermediate session and the initial session has a range of about 2 to about 3. In some embodiments, a duration length ratio between the intermediate session and the final session has a range of about 2 to about 3.

The Ge concentration may peak at the middle portion M and smoothly or steeply drop there-from along a thickness direction.

For instance, referring to FIG. 7B, in some embodiments, the Ge concentration distribution of the SiGe layer 622U decreases nonlinearly from the middle portion M upwardly and downwardly along a thickness direction. In the illustrated embodiment, the distribution of Ge concentration may be a normal distribution.

Referring to FIG. 7C, in some embodiments, the Ge concentration distribution of the SiGe layer 622U has a step-shaped profile along the thickness direction. In the illustrated embodiment, the Ge concentration distribution profile may be a rectangular function-shaped, in which the concentration is constant throughout each of the middle portion M and the two neighboring portions U, B.

Referring to FIG. 7D, in some embodiments, the Ge concentration distribution of the SiGe layer 622U decreases linearly from the middle portion M upwardly and downwardly along a thickness direction. In an embodiment as illustrated in FIG. 7D, the Ge concentration profile may form a triangular function-shaped distribution, in which the Ge concentration is peaked at the middle portion M and decreases linearly there-from.

Figure 8:
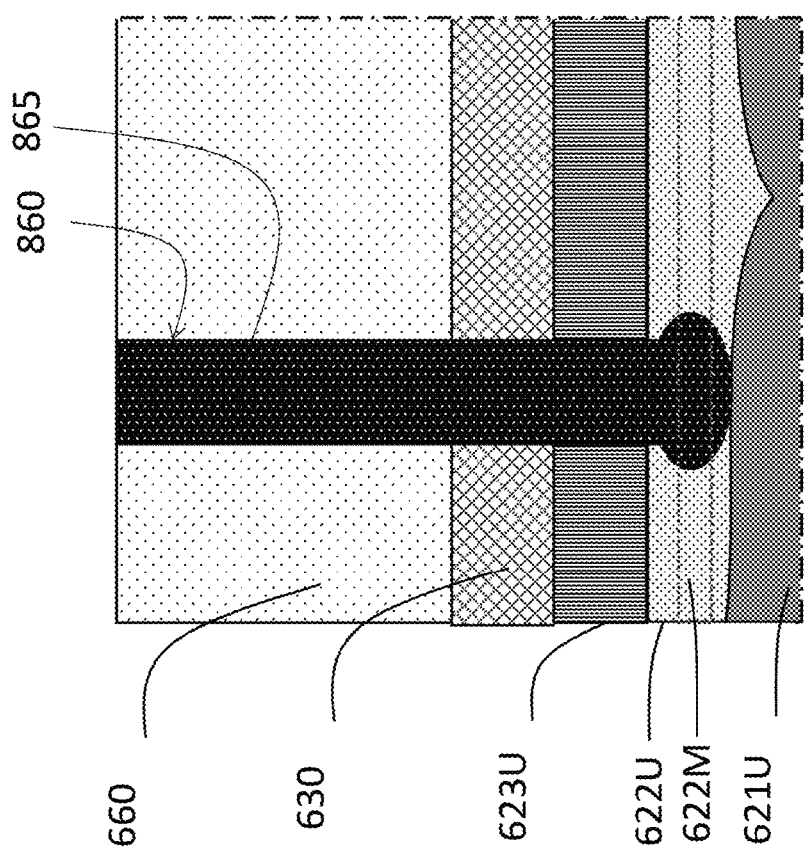
FIG. 8 illustrates cross-sectional views of a profile of a contact feature in a semiconductor device in accordance with some embodiments of the instant disclosure.

FIG. 8 illustrates cross-sectional view of an intermediate stage of fabricating semiconductor device in accordance with some embodiments of the instant disclosure.

In the illustrative embodiment, a contact feature 865 penetrating the interlayer dielectric layer 660, buffer layer 630, and top conductive layer 623U and arriving at the SiGe layer 622U. The interlayer dielectric layer 660, buffer layer 630, top conductive layer 623U and, SiGe layer 622U may be etched to form a contact hole 860 for housing a subsequently formed contact feature 865. Contact feature 865 enables vertical electrical connection between the SiGe layer 622U and an upper metal line (e.g., metal line 170) over the interlayer dielectric layer 660.

During formation of the contact hole 860, as the Ge content of the SiGe layer 622U increases, the horizontally overetch amount may increase. For instance, the illustrated embodiment shows that the etched profile of the contact hole 860 has a widest portion in the middle portion M.

FIG. 9 illustrates cross-sectional view of an intermediate stage of fabricating semiconductor device in accordance with some embodiments of the instant disclosure.

Figure 9A:
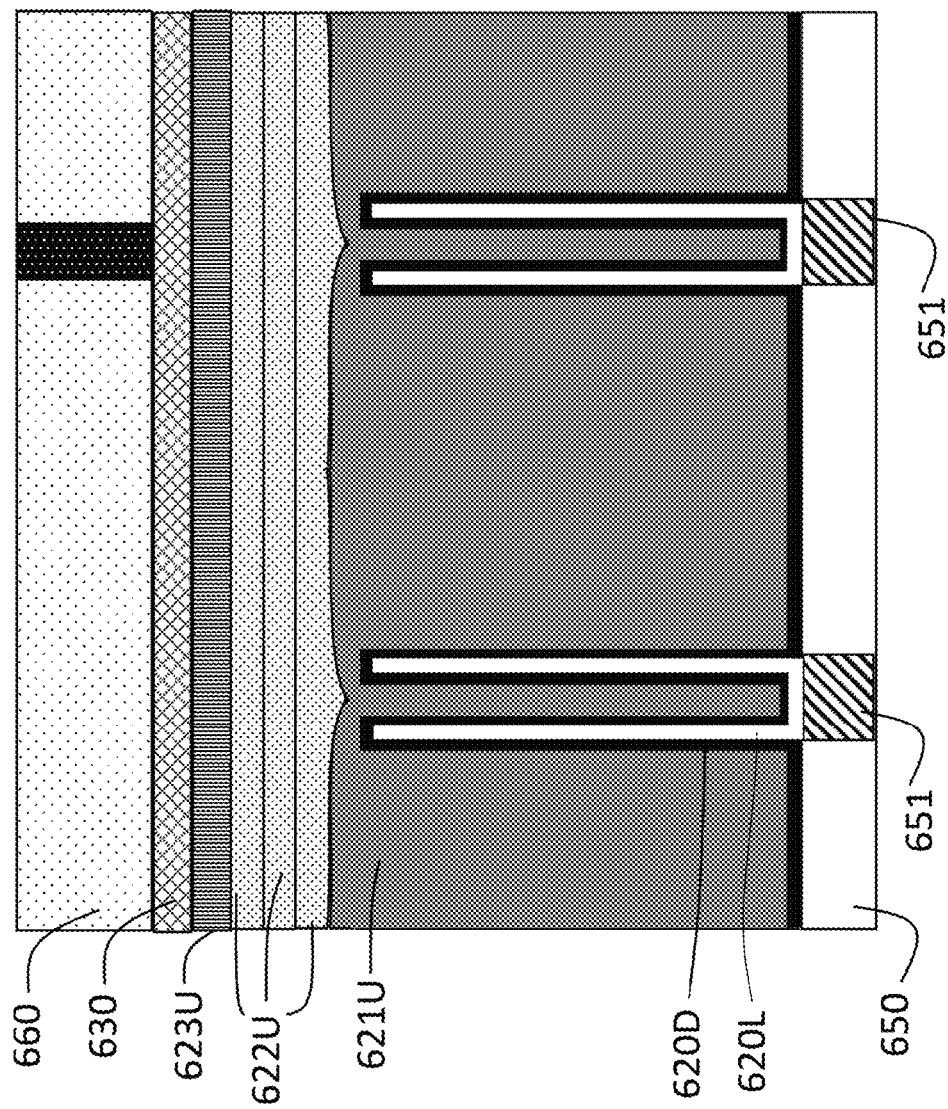
FIG. 9A illustrates a cross-sectional view of an exemplary semiconductor device in accordance with some embodiments of the instant disclosure.

Referring to FIG. 9A, a plurality of the SiGe layer formation process is performed to form a plurality of the SiGe layers 622U stacked over the conductive layer 612U. In the illustrated embodiments, a thickness of the stacked SiGe layers 622U is in a range from about 1200 to about 1600 Å. In some embodiments, the thickness of the stacked SiGe layers 622U is about 1500 Å. A thickness of the middle portion of each of the SiGe layer 622U is in a range from about 100 to about 200 Å.

In some embodiments, the Ge concentration less than about 80% in the middle portion M may be formed by an in-situ LPCVD process. In the in-situ LPCVD process, the temperatures may be set around 350-550° C., and the processing gas pressure may be set around 0.5-200 torr. Further, the gaseous reaction agent may be $SiH_4$ with 10% diluted $GeH_4$ (in $H_2$); and the dopant gas may be 1% diluted $PH_3$ (in $N_2$) or 1% diluted $BCl_3$ (in $N_2$). The LPCVD process may be composed of multi-recipe. For example, a low-concentration Ge layer is grown, followed by purge/pumping, and the amount of $GeH_4$ flow is increased to grow a high-concentration Ge layer. This cycle may be repeated to form the multilayer.

Figure 9B:
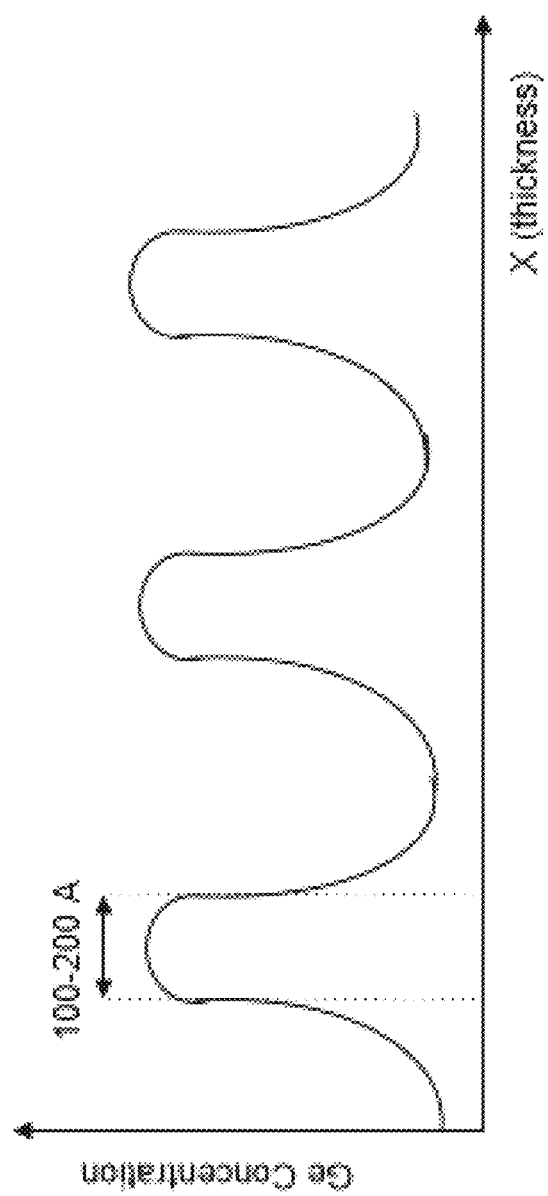
FIG. 9B illustrates Ge content concentration of a stacked silicon germanium layers in accordance with some embodiments of the instant disclosure.

Referring to FIG. 9B, the Ge concentration distribution of stacked SiGe layers 622U may be periodically distributed. FIG. 9B schematically illustrates a periodically fluctuating Ge concentration profile along the x-axis (or the thickness direction) according to one exemplary embodiment. In FIG. 9B, the Ge concentration profile is a multiple repetition of the distribution of FIG. 7B. In some embodiments, the Ge concentration profile may be a multiple repetition of the Ge distribution shown in FIG. 7B, 7C, 7D, or a combination thereof.

Figure 10A:
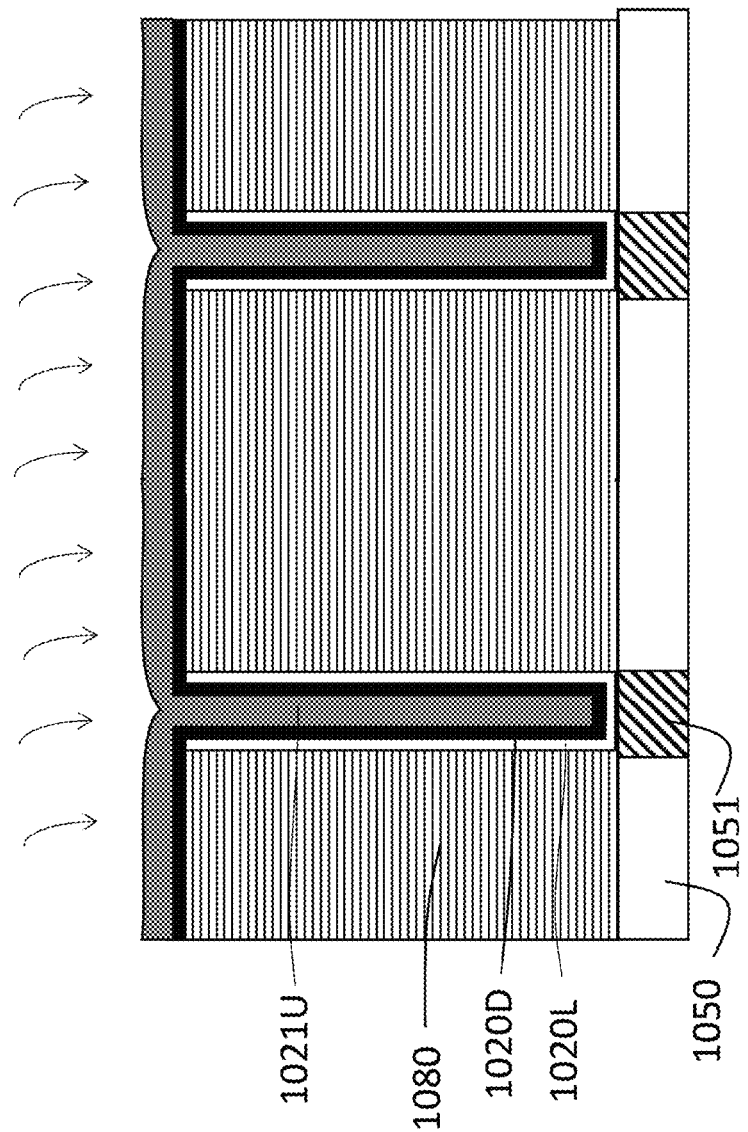
FIGS. 10A-10C illustrate cross-sectional views of intermediate stages of fabricating semiconductor device in accordance with some embodiments of the instant disclosure.
Figure 10B:
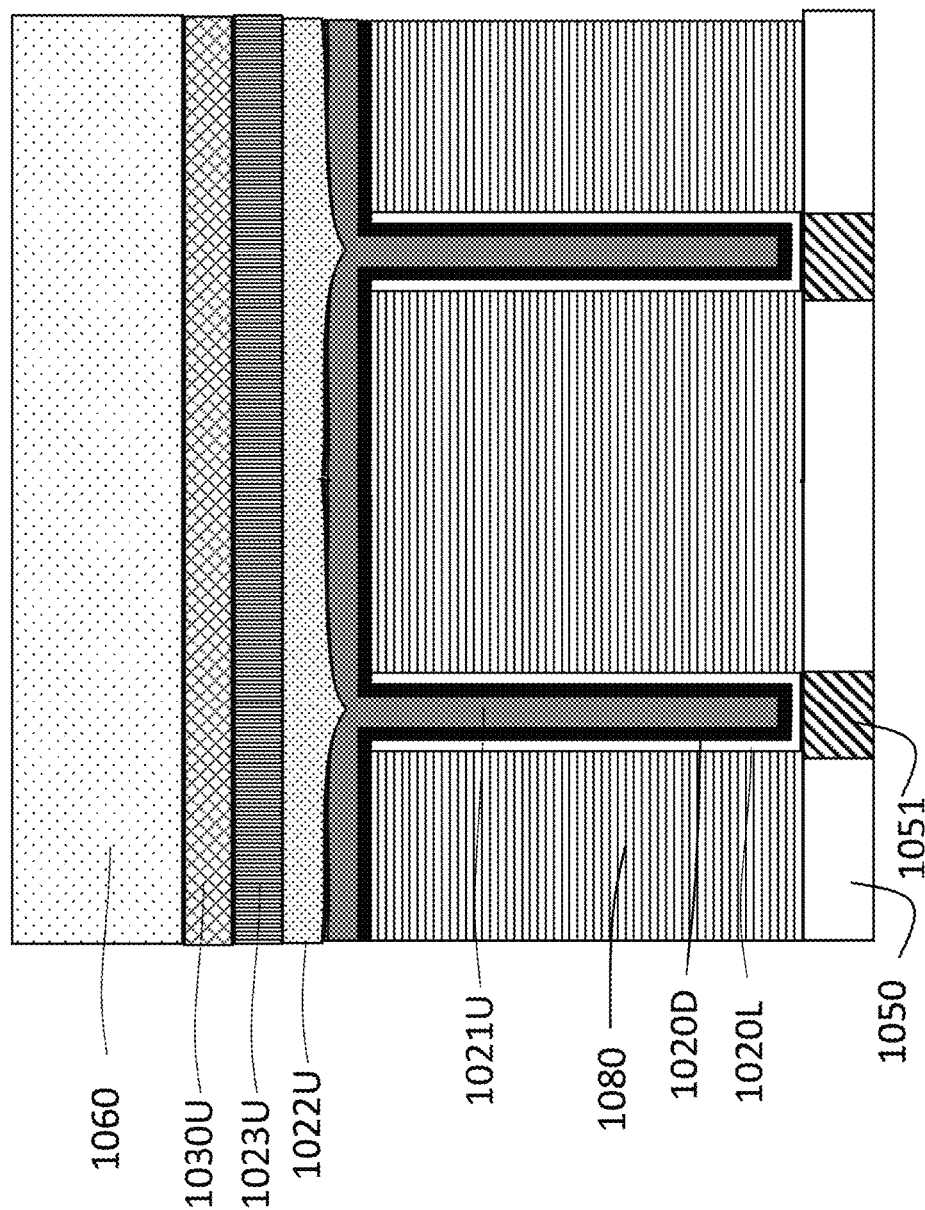
Figure 10C:
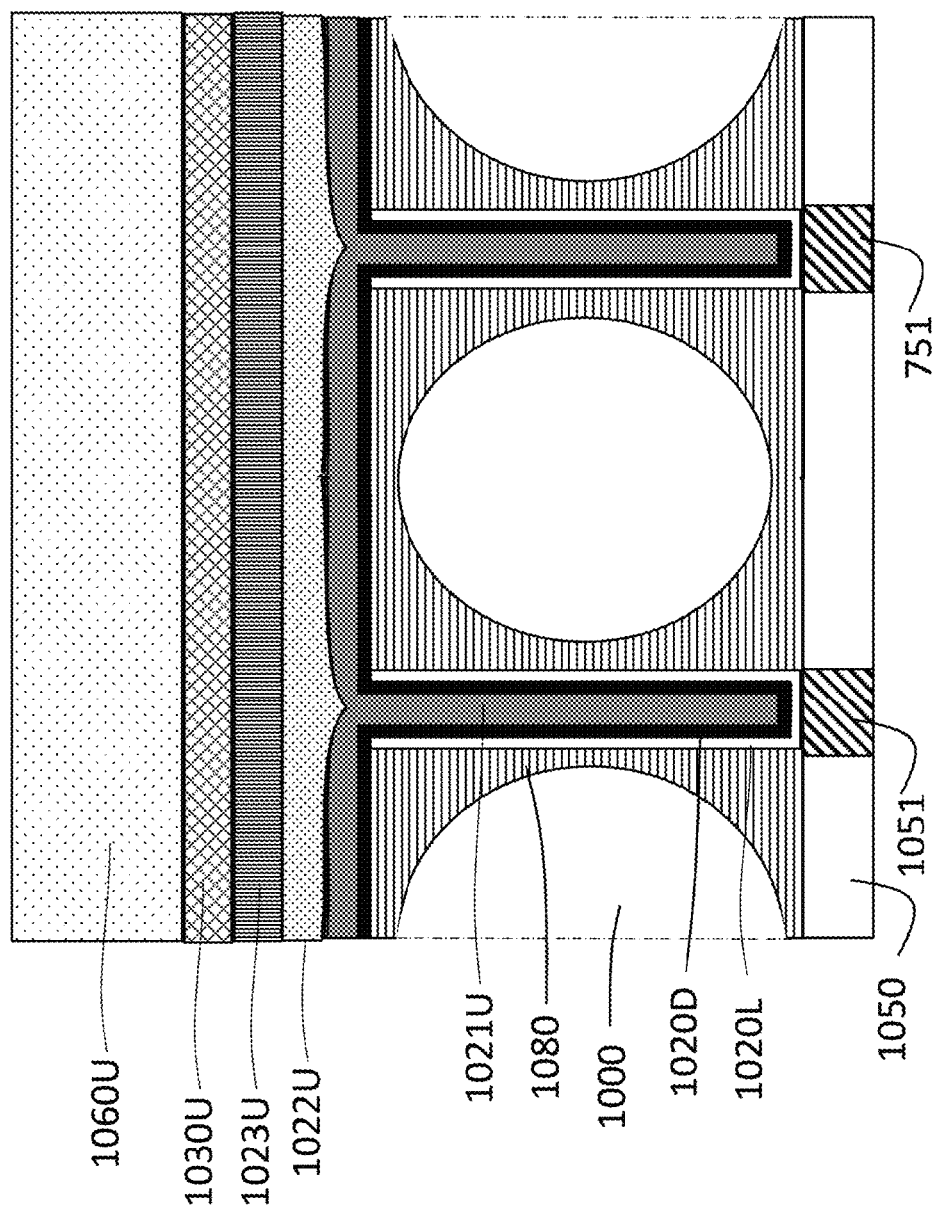

FIG. 10A to 10C illustrate cross-sectional view of intermediate stages of fabricating semiconductor device in accordance with some embodiments of the instant disclosure.

Referring to FIG. 10A, a mold layer 1080, a dielectric liner 1020D, a plurality of capacitor lower electrodes 1020L, and conductive layer 1021U are formed over an interlayer dielectric layer 1050. The aforementioned fabrication flow described in conjunction with accompany drawings in FIG. 2A to FIG. 2B may be utilized when forming the mold layer 1080 and the capacitor lower electrodes 1020L. In the exemplary embodiment, the aforementioned passivation process may be performed on a top surface of the conductive layer 1021U, thereby enhancing the thickness uniformity of subsequentially formed SiGe layer.

In the illustrated embodiment, the mold layer 1080 is not removed before the deposition of subsequentially formed dielectric liner 1020D. The mold layer 1080 may act as capacitor dielectric. For instance, a thickness of the mold layer 1080 may be adjusted to achieve a requirement on capacitance of a capacitor. In such embodiments, the mold layer 1080 may be referred to as a dielectric layer. The mold layer 1080 may be formed by coating an oxide, for example, boro-phospho slilicate glass (BPSG), phospho slilicate glass (PSG), undoped silica glass (USG), spin on glass (SOG), plasma enhanced tetraethylorthosilicate (PETEOS), and/or the like.

Referring to FIG. 10B, a SiGe layer 1022U, a top conductive layer 1023U, a buffer layer 1030 and an interlayer dielectric layer 1060 are sequentially formed on the conductive layer 1021U. The formation of the SeGi layer 1022U, top conductive layer 1023U, buffer layer 1030 and interlayer dielectric layer 1060 may utilize fabrication processes described in conjunction with FIG. 6B.

Referring to FIG. 10C, voids (also referred as to air gaps) 1000 are formed in the dielectric liner 1080 between adjacent bottom electrodes 1020L in the illustrated embodiment. The air gap 1000 may be formed by partially removing the mold layer 1080 through etching. As air gap possesses very low dielectric constant, the provision of air gaps between neighboring capacitor electrodes may help to reduce parasitic capacitance between storage cells, thereby enhancing operational efficiency of the device. It is noted that the specific shape and size of an air gap may vary in accordance with the formation process, and may not necessarily appear as the schematic illustration shown in the exemplary figure.

Accordingly, one aspect of the instant disclosure provides a semiconductor device that comprises a capacitor structure formed over a device region of a substrate, and a buffer layer. The capacitor structure comprises a lower electrode having a U-shaped profile that opens away from the substrate, the U-shaped profile defines an interior surface and an opposing exterior surface; a dielectric liner extending into the U-shaped profile and conformally covering the interior surface of the lower electrode; and an upper electrode formed over the dielectric liner, extending into and filling the U-shaped profile, the upper electrode) includes a top conductive layer. The buffer layer formed on the top conductive layer of the upper electrode, wherein the lattice constant of the buffer layer is greater than that of the top conductive layer.

In some embodiments, a major metal content in the buffer layer is different from that in the top conductive layer.

In some embodiments, a portion of the top conductive layer of the upper electrode above the lower electrode has a greater thickness.

In some embodiments, the dielectric liner further conformally covers the exterior surface of the lower electrode; and the upper electrode further surrounds the exterior surface of the lower electrode.

In some embodiments, the upper electrode further comprises a conductive layer formed to conformally lining cover the dielectric liner; and a conductive material formed between the conductive layer and the top conductive layer, filling in the U-shaped profile of the lower electrode.

In some embodiments, the device further comprises a void neighboring the exterior surface of the lower electrode.

In some embodiments, further comprise a plurality of the lower electrodes formed over the substrate; the upper electrode covers the lower electrodes and has a plateau profile in a cross section thereof; and a thickness of a portion of the buffer layer on top surface of the plateau profile is greater than that of a portion of the buffer layer covering sidewall surface of the plateau profile.

In some embodiments, sidewall surface of the plateau profile is substantially free from the buffer layer.

In some embodiments, a thickness the buffer layer is in a range from about 1 to 100 nm.

In some embodiments, the buffer layer selectively comprises a nitrides metal compound, a carbide metal compound, and a carbon nitride metal compound; the metal content in the buffer layer selectively comprises titanium and aluminum.

In some embodiments, the top conductive layer of the upper electrode has a downward pointing ridge profile above the lower electrode.

In some embodiments, the buffer layer electronically connects with the top conductive layer.

In some embodiments, the upper electrode (223) further comprises a conductive layer formed to conformally cover the dielectric liner and filling in and between the U-shaped profile of the lower electrode, wherein the conductive layer includes a substantially planar top surface; and a SiGe layer formed between the conductive layer and the top conductive layer, wherein the SiGe layer has Ge concentration distribution that has a greatest value at a middle portion of the SiGe layer and decreases there-from upwardly and downwardly along a thickness direction.

Accordingly, one aspect of instant disclosure provides a semiconductor device comprises a capacitor structure formed over a device region of a substrate. The capacitor structure comprises a lower electrode having a U-shaped profile that opens away from the substrate, the U-shaped profile defines an interior surface and an opposing exterior surface; a dielectric liner extending into the U-shaped profile and conformally covering the interior surface of the lower electrode; an upper electrode formed over the dielectric liner, extending into and filling the U-shaped profile, the upper electrode includes a top conductive layer, wherein a portion of the top conductive layer above the lower electrode has greater thickness. The semiconductor device further comprises a buffer layer formed on the top conductive layer.

In some embodiments, a lattice constant of the buffer layer is greater than that of the top conductive layer.

In some embodiments, a major metal content in the buffer layer (230) is different from that in the top conductive layer.

Accordingly, one aspect of instant disclosure provides a method, comprises forming a lower electrode having a U-shaped profile that opens away from a substrate; forming a dielectric liner extending into the U-shaped profile and conformally covering interior surface of the lower electrode; forming an upper electrode over the dielectric liner, extending into and filling the U-shaped profile; and depositing a buffer layer on top surface of the upper electrode, wherein the buffer layer has a lattice constant greater than that of a top portion of the upper electrode.

In some embodiments, the depositing the buffer layer further comprises depositing the buffer layer via physical vapor deposition (PVD).

In some embodiments, a major metal content in the buffer layer is different from that in the top portion of the upper electrode.

In some embodiments, the forming the upper electrode comprises disposing a conductive layer on the dielectric liner; performing a passivation process to top surface of the conductive layer; disposing a SiGe layer on the passivation layer; and disposing a top conductive layer on the SiGe layer.

The embodiments shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A semiconductor device, comprising:
   a capacitor structure formed over a device region of a substrate, the capacitor structure comprising:
      a lower electrode having a U-shaped profile that opens away from the substrate, the U-shaped profile defines an interior surface and an opposing exterior surface;
      a dielectric liner extending into the U-shaped profile and conformally covering the interior surface of the lower electrode; and
      an upper electrode formed over the dielectric liner, extending into and filling the U-shaped profile, the upper electrode includes a top conductive layer; and
   a buffer layer formed on the top conductive layer of the upper electrode, wherein the lattice constant of the buffer layer is greater than that of the top conductive layer, wherein the buffer layer selectively comprises a nitride metal compound, a carbide metal compound, and a carbon nitride metal compound, a major metal content in the buffer layer selectively comprises titanium and aluminum.

2. The device of claim 1, wherein
   the major metal content in the buffer layer is different from that in the top conductive layer.

3. The device of claim 1, wherein
   a portion of the top conductive layer of the upper electrode above the lower electrode has a greater thickness.

4. The device of claim 1, wherein
   the dielectric liner further conformally covers the exterior surface of the lower electrode; and
   the upper electrode further surrounds the exterior surface of the lower electrode.

5. The device of claim 1, wherein the upper electrode further comprises
   a conductive layer formed to conformally lining cover the dielectric liner; and
   a conductive material formed between the conductive liner and the top conductive layer, filling in and between the U-shaped profile of the lower electrode.

6. The device of claim 1, further comprising
   a void neighboring the exterior surface of the lower electrode.

7. The device of claim 1,
   further comprise a plurality of the lower electrodes formed over the substrate;
   wherein the upper electrode covers the lower electrodes and has a plateau profile in a cross section thereof; and
   wherein a thickness of a portion of the buffer layer on top surface of the plateau profile is greater than that of a portion of the buffer layer covering sidewall surface of the plateau profile.

8. The device of claim 7, further comprises
   wherein sidewall surface of the plateau profile is substantially free from the buffer layer.

9. The device of claim 1, wherein
   a thickness the buffer layer is in a range from about 1 to 100 nm.

10. The device of claim 1,
    wherein the top conductive layer of the upper electrode has a downward pointing ridge profile above the lower electrode.

11. The device of claim 1, wherein
the buffer layer electronically connects with the top conductive layer.

12. The device of claim 1, wherein the upper electrode further comprises
a conductive layer formed over the dielectric liner and filling in and between the U-shaped profile of the lower electrode, wherein the conductive layer includes a substantially planar top surface; and
a SiGe layer formed between the conductive layer and the top conductive layer, wherein the SiGe layer has a Ge concentration distribution that has a greatest value at a middle portion of the SiGe layer and decreases therefrom upwardly and downwardly along a thickness direction.

13. A semiconductor device, comprising:
a capacitor structure formed over a device region of a substrate, the capacitor structure comprising:
a lower electrode having a U-shaped profile that opens away from the substrate, the U-shaped profile defines an interior surface and an opposing exterior surface;
a dielectric liner extending into the U-shaped profile and conformally covering the interior surface of the lower electrode; and
an upper electrode formed over the dielectric liner, extending into and filling the U-shaped profile, the upper electrode includes a top conductive layer, wherein a portion of the top conductive layer above the lower electrode has greater thickness; and
a buffer layer formed on the top conductive layer, wherein the buffer layer selectively comprises a nitride metal compound, a carbide metal compound, and a carbon nitride metal compound, a major metal content in the buffer layer selectively comprises titanium and aluminum.

14. The device of claim 13, wherein
a lattice constant of the buffer layer is greater than that of the top conductive layer.

15. The device of claim 13, wherein
the major metal content in the buffer layer is different from that in the top conductive layer.

16. A method, comprising:
forming a lower electrode having a U-shaped profile that opens away from a substrate;
forming a dielectric liner extending into the U-shaped profile and conformally covering interior surface of the lower electrode;
forming an upper electrode over the dielectric liner, extending into and filling the U-shaped profile; and
depositing a buffer layer on a top surface of the upper electrode, wherein the buffer layer has a lattice constant greater than that of a top portion of the upper electrode, wherein the buffer layer selectively comprises a nitride metal compound, a carbide metal compound, and a carbon nitride metal compound, a major metal content in the buffer layer selectively comprises titanium and aluminum.

17. The method of claim 16, wherein depositing the buffer layer further comprises
depositing the buffer layer via physical vapor deposition.

18. The method of claim 16, wherein the major metal content in the buffer layer is different from that in the top portion of the upper electrode.

19. The method of claim 16, wherein the forming the upper electrode comprises
disposing a conductive layer on the dielectric liner;
performing a passivation process to top surface of the conductive layer;
disposing a SiGe layer on the passivation layer; and
disposing a top conductive layer on the SiGe layer.

* * * * *